United States Patent
O'Mathuna et al.

(10) Patent No.: US 12,217,891 B2
(45) Date of Patent: Feb. 4, 2025

(54) VERTICAL MAGNETIC STRUCTURE FOR INTEGRATED POWER CONVERSION

(71) Applicant: UNIVERSITY COLLEGE CORK—NATIONAL UNIVERSITY OF IRELAND, Cork (IE)

(72) Inventors: Cian O'Mathuna, Cork (IE); Daniel Smallwood, Cork (IE); Zoran Pavlovic, Cork (IE); Hugh Smiddy, Cork (IE); Seamus O'Driscoll, Cork (IE); Paul McCloskey, Cork (IE)

(73) Assignee: UNIVERSITY COLLEGE CORK—NATIONAL UNIVERSITY OF IRELAND, Cork (IE)

( * ) Notice: Subject to any disclaimer, the term of this patent is extended or adjusted under 35 U.S.C. 154(b) by 839 days.

(21) Appl. No.: 17/285,751

(22) PCT Filed: Oct. 15, 2019

(86) PCT No.: PCT/EP2019/077978
§ 371 (c)(1),
(2) Date: Apr. 15, 2021

(87) PCT Pub. No.: WO2020/079002
PCT Pub. Date: Apr. 23, 2020

(65) Prior Publication Data
US 2022/0005640 A1    Jan. 6, 2022

Related U.S. Application Data

(60) Provisional application No. 62/745,901, filed on Oct. 15, 2018.

(30) Foreign Application Priority Data

Oct. 16, 2018 (GB) .................... 1816833.6

(51) Int. Cl.
H01F 27/28 (2006.01)
H01F 17/00 (2006.01)
(Continued)

(52) U.S. Cl.
CPC ..... *H01F 17/0013* (2013.01); *H01F 27/2804* (2013.01); *H01F 41/046* (2013.01);
(Continued)

(58) Field of Classification Search
CPC ............. H01F 17/0013; H01F 27/2804; H01F 41/046; H01F 2017/0066;
(Continued)

(56) References Cited

U.S. PATENT DOCUMENTS

| 6,121,852 A * | 9/2000 | Mizoguchi .............. H01P 1/215 336/200 |
| 2009/0126983 A1* | 5/2009 | Harvey ................. H05K 1/0233 174/266 |

(Continued)

FOREIGN PATENT DOCUMENTS

| CN | 106653318 | 5/2017 |
| EP | 3364427 | 8/2018 |

(Continued)

OTHER PUBLICATIONS

PCT International Search Report and PCT Written Opinion for PCT International Application No. PCT/EP2019/077978 (28 pages).

*Primary Examiner* — Shawki S Ismail
*Assistant Examiner* — Kazi S Hossain
(74) *Attorney, Agent, or Firm* — K&L GATES LLP

(57) ABSTRACT

The present invention provides an inductor device comprising one or more interconnected columns of conductive material embedded in a supporting structure, wherein the
(Continued)

one or more columns comprise an input terminal and an output terminal; and wherein each column is surrounded by a first magnetic layer.

29 Claims, 28 Drawing Sheets

(51) Int. Cl.
  *H01F 41/04* (2006.01)
  *H05K 1/16* (2006.01)
(52) U.S. Cl.
  CPC ..... *H05K 1/165* (2013.01); *H01F 2017/0066* (2013.01); *H01F 2027/2809* (2013.01)
(58) Field of Classification Search
  CPC ............ H01F 2027/2809; H05K 1/165; H05K 2201/083; H05K 2201/09609
  USPC ........................................ 336/200, 232, 192
  See application file for complete search history.

(56) References Cited

U.S. PATENT DOCUMENTS

| | | | |
|---|---|---|---|
| 2014/0092574 | A1 | 4/2014 | Zillman et al. |
| 2014/0104288 | A1* | 4/2014 | Shenoy ............... H01F 17/0033 336/20 |
| 2014/0266543 | A1 | 9/2014 | Park et al. |
| 2015/0200049 | A1* | 7/2015 | Kim .................... H01F 27/2804 336/200 |
| 2015/0200050 | A1 | 7/2015 | Nakao et al. |
| 2017/0140862 | A1 | 5/2017 | Yun et al. |
| 2019/0355500 | A1* | 11/2019 | Lee .......................... H01F 1/34 |

FOREIGN PATENT DOCUMENTS

| | | |
|---|---|---|
| JP | 2002289419 | 10/2002 |
| WO | 2018043318 | 3/2018 |

* cited by examiner

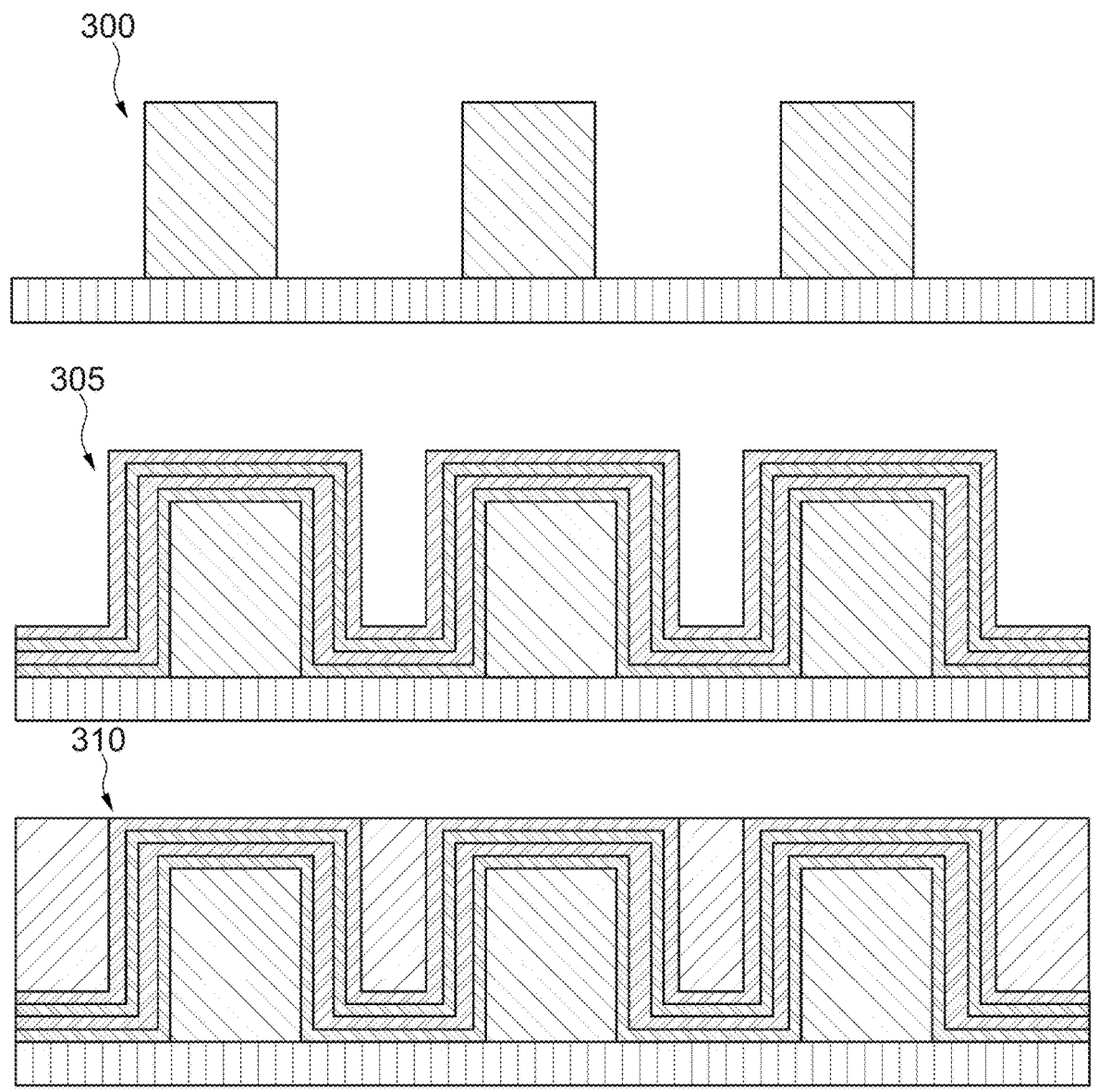
Fig. 3.1

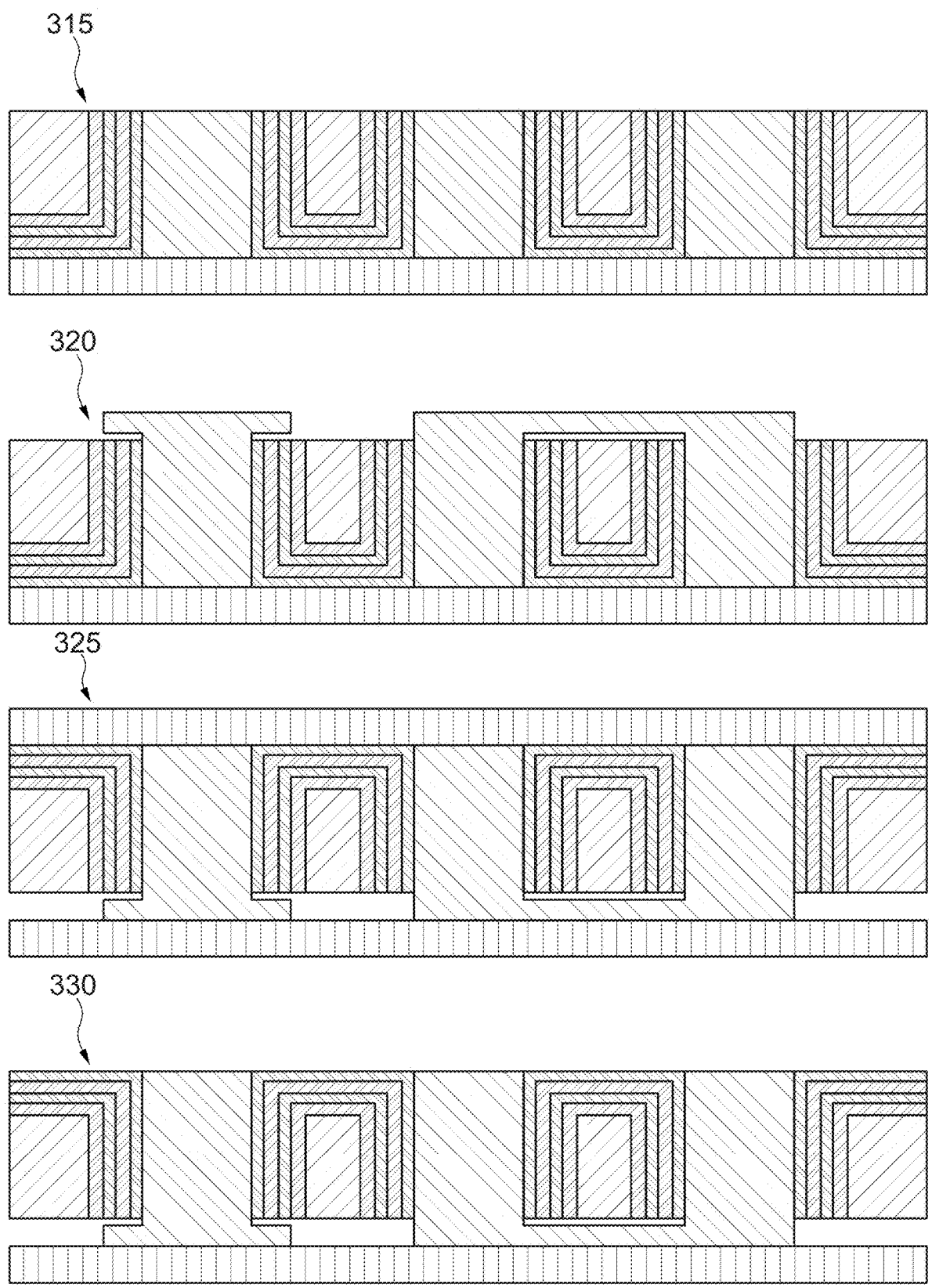
Fig. 3.2

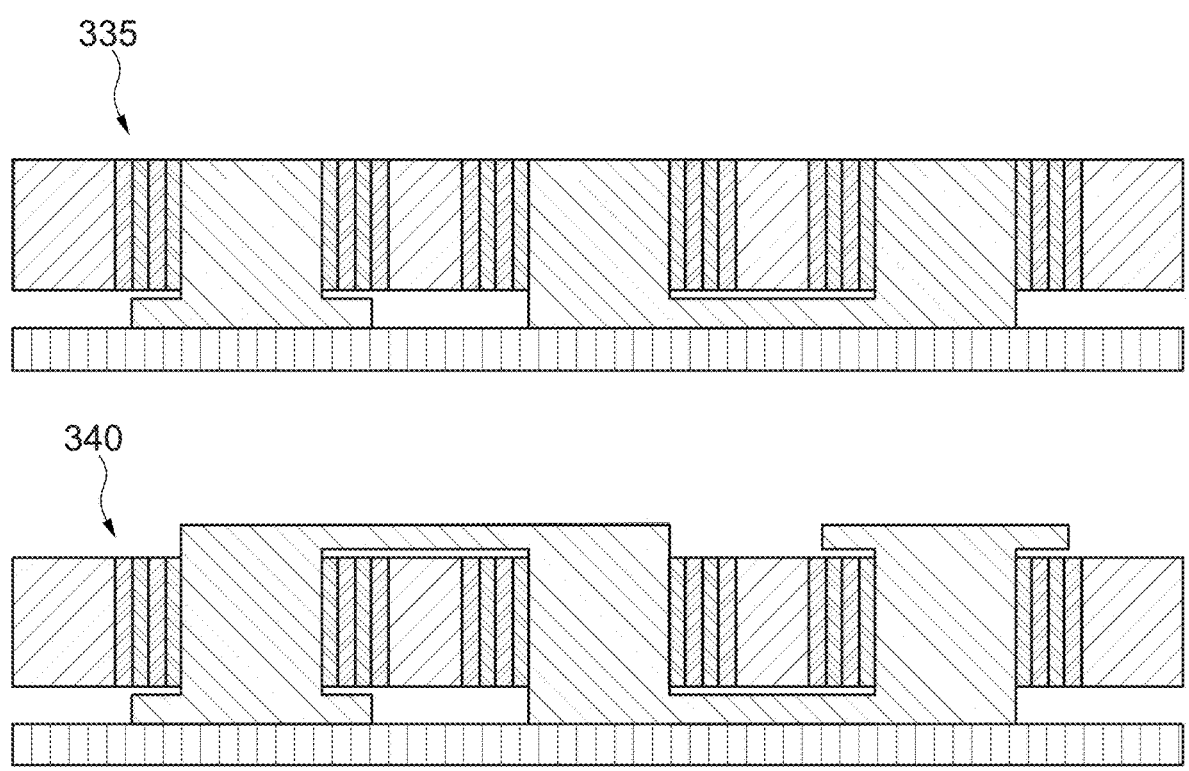
Fig. 3.3

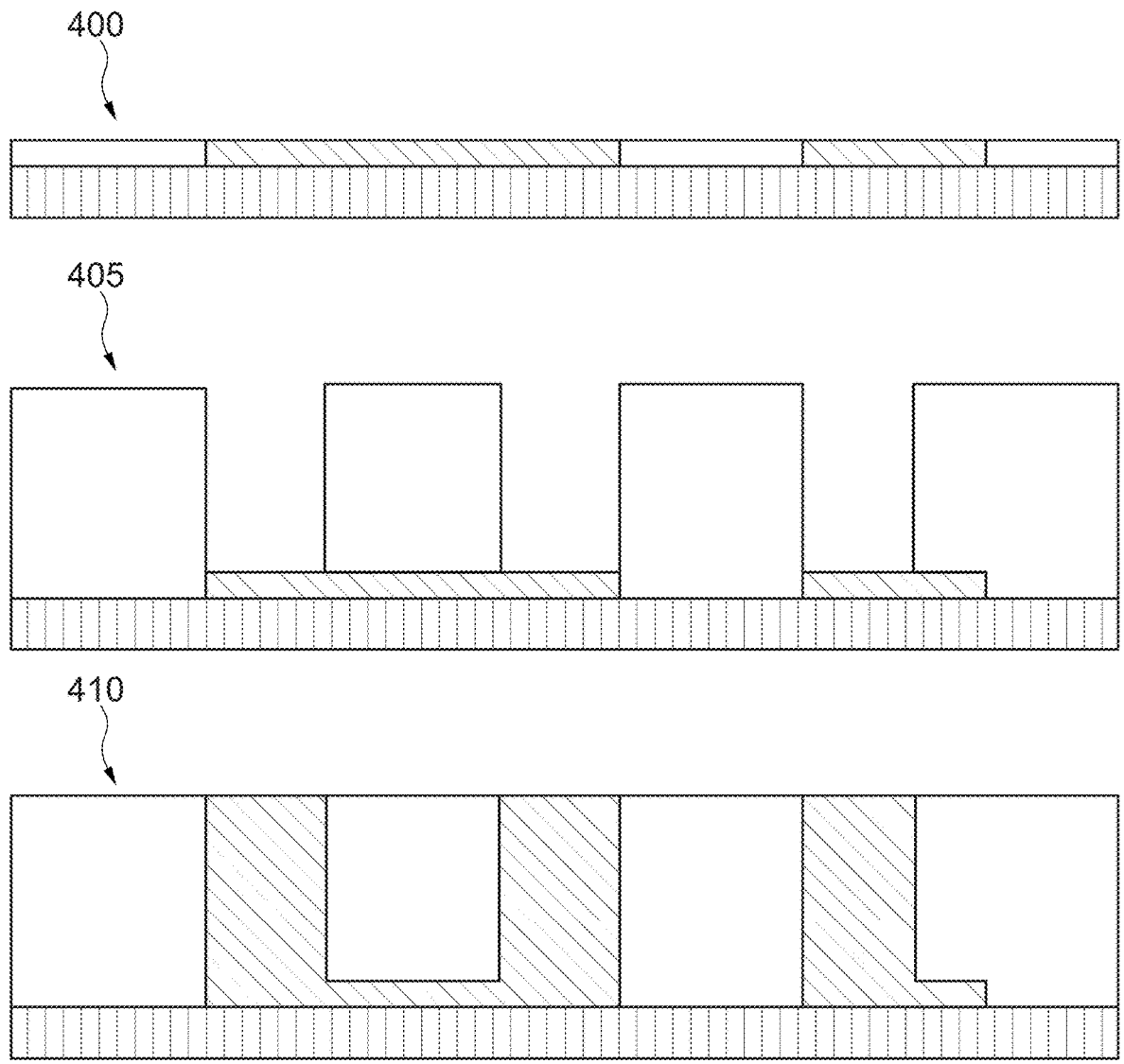
Fig. 4.1

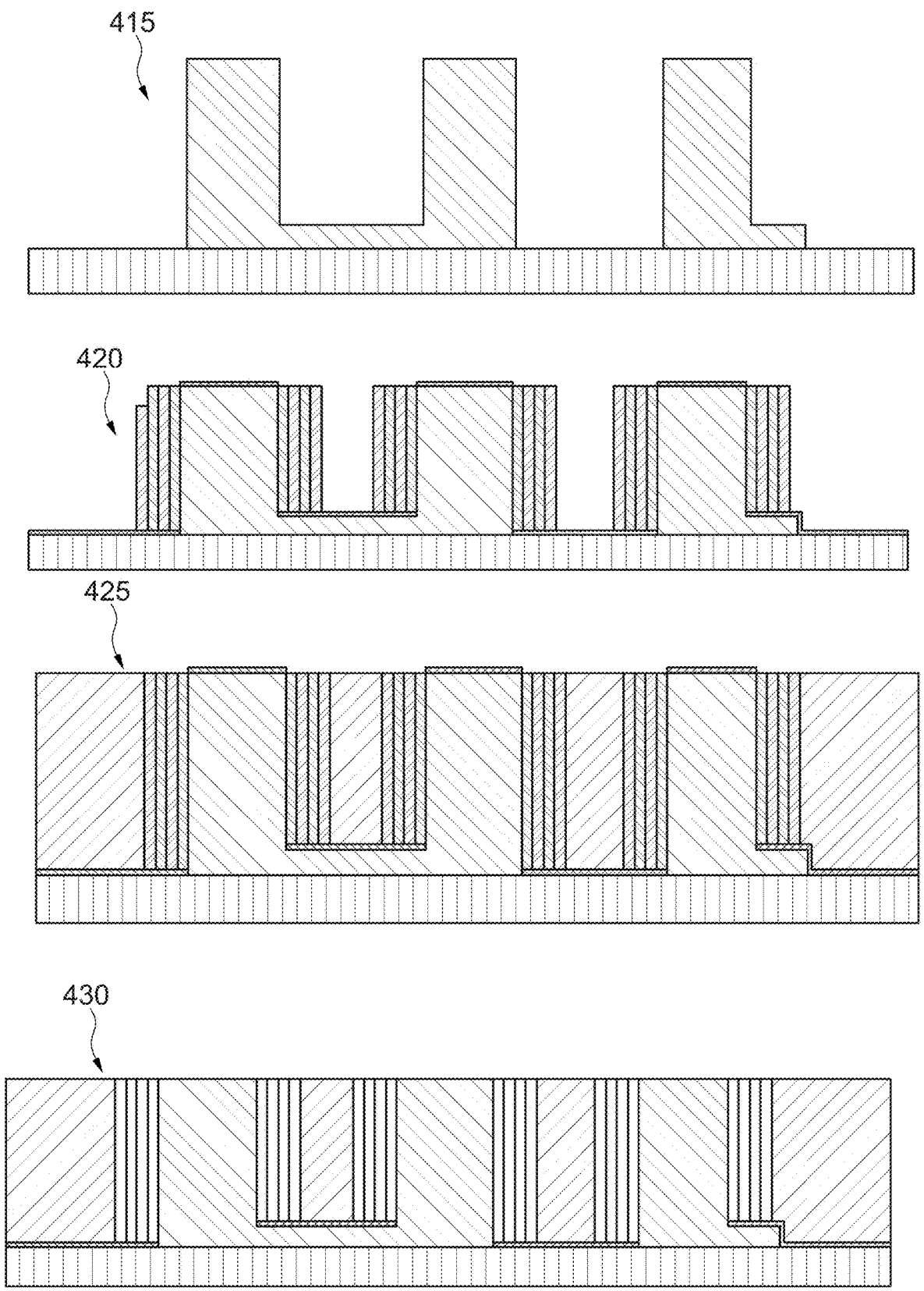
Fig. 4.2

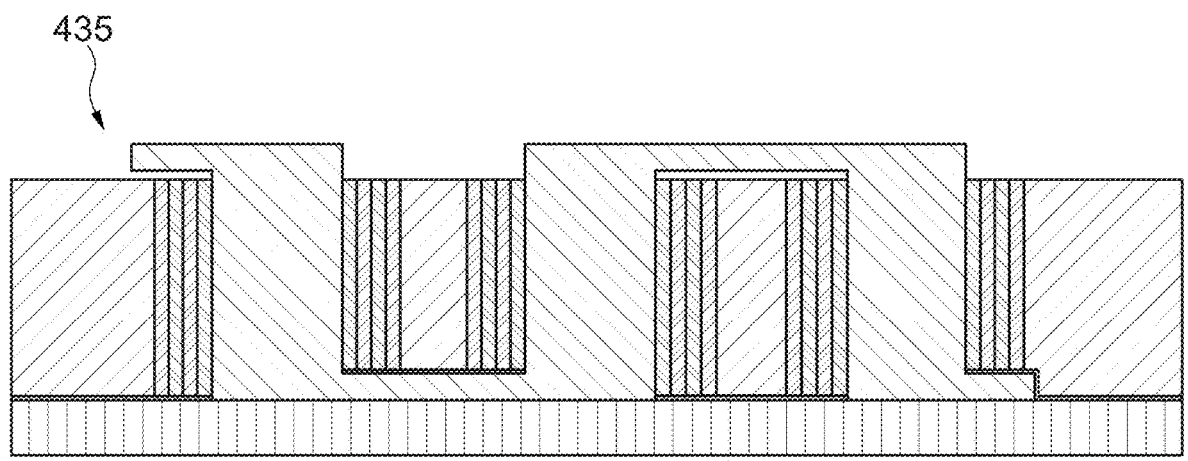
Fig. 4.3

Example top-down view
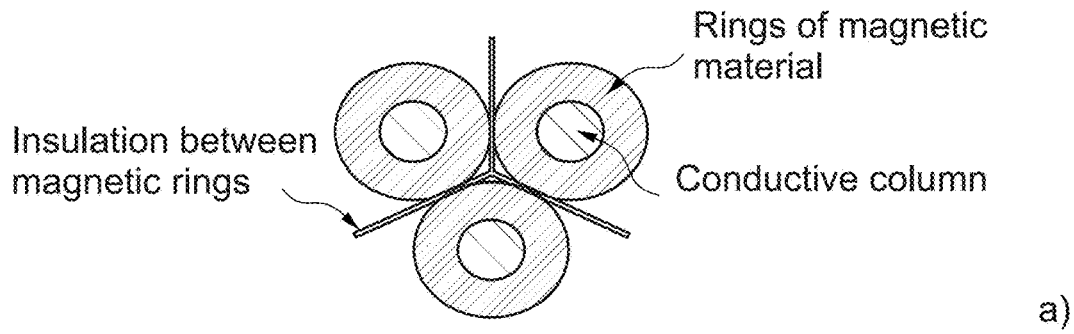
a)
Side view
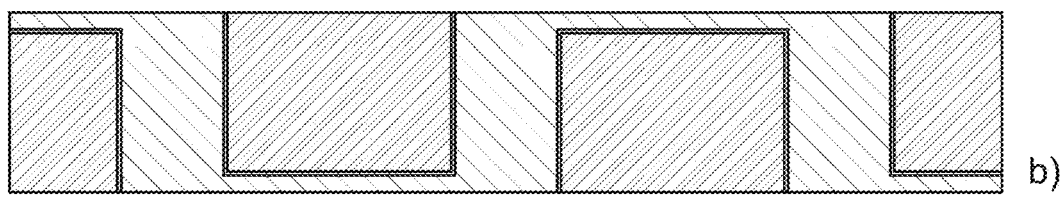
b)
A solid sheet of magnetic material surrounds the columns and acts as a supporting structure
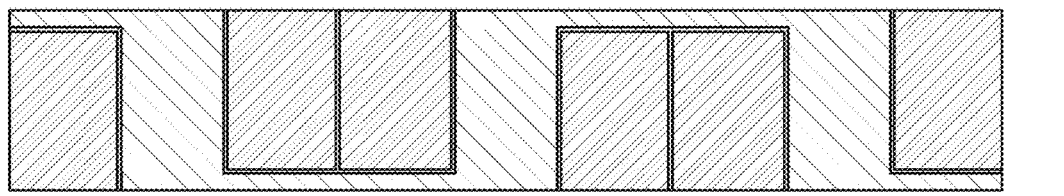
c)
Solid rings of magnetic material surround the columns
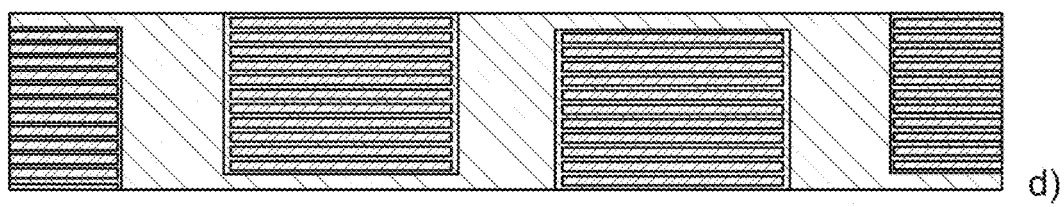
d)
A laminated solid sheet of magnetic material surround the columns
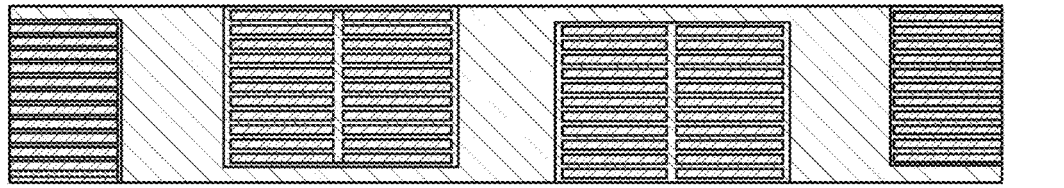
e)
Laminated rings of magnetic material surround the columns
Fig. 5

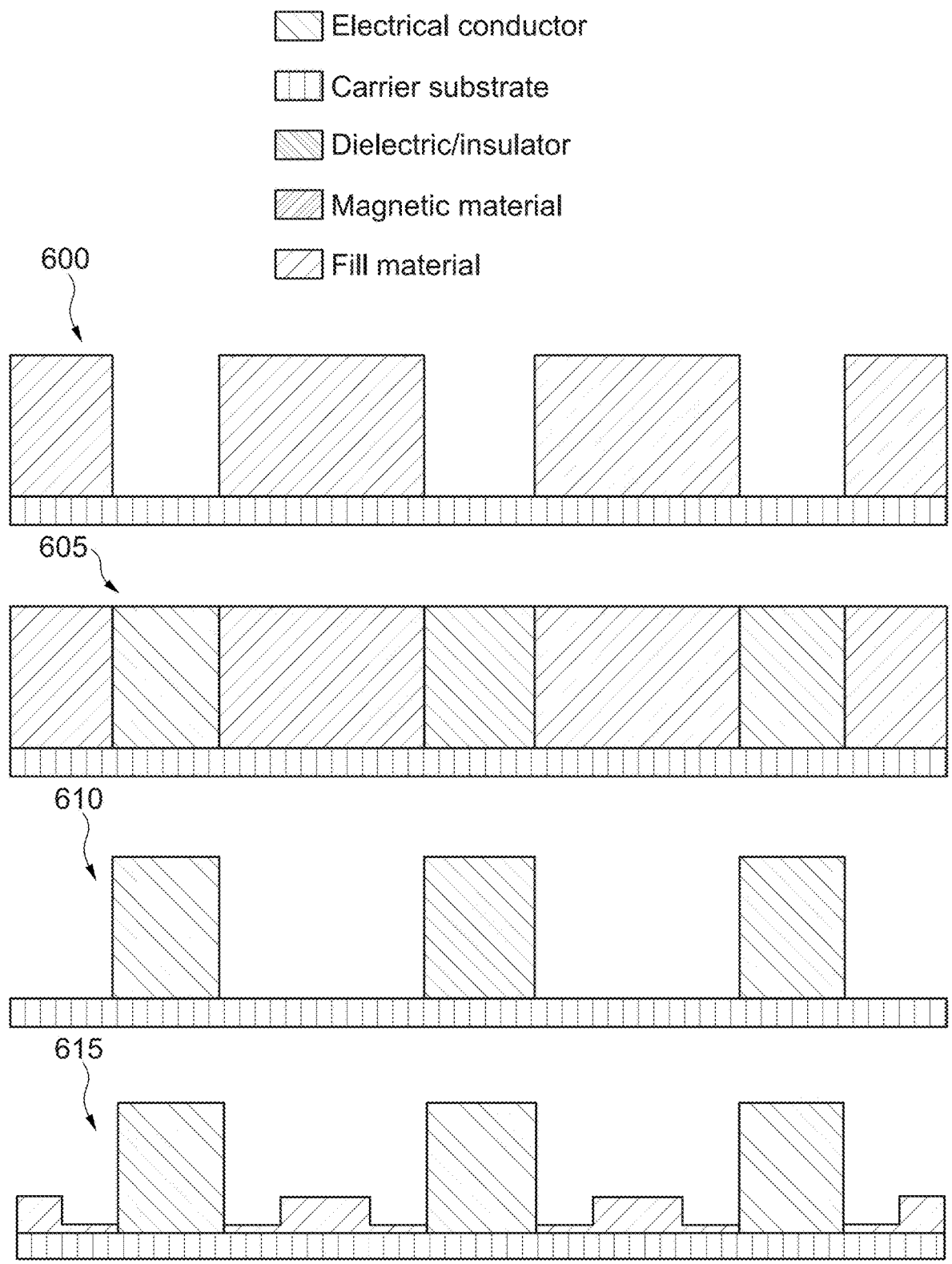
Fig. 6.1

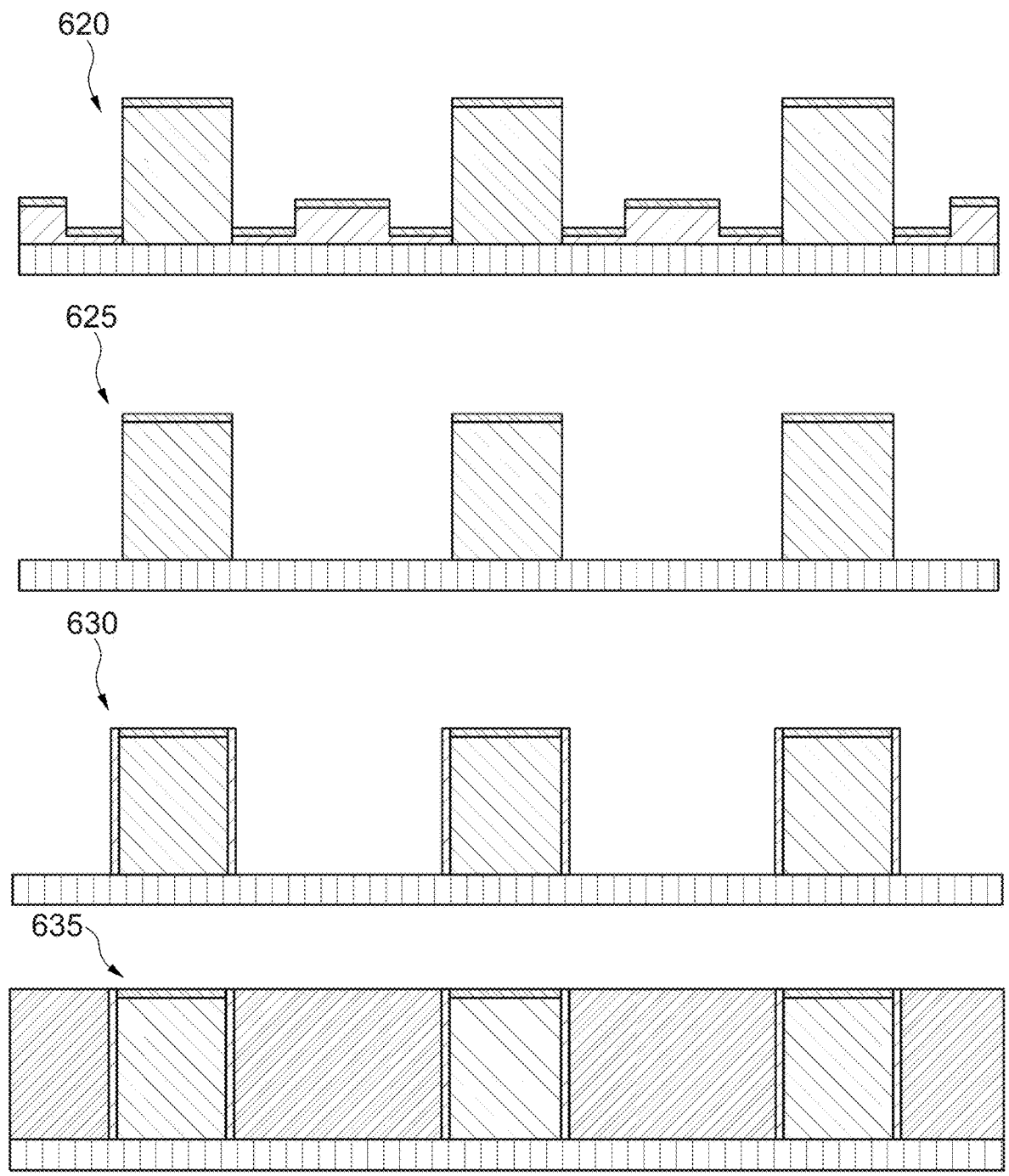
Fig. 6.2

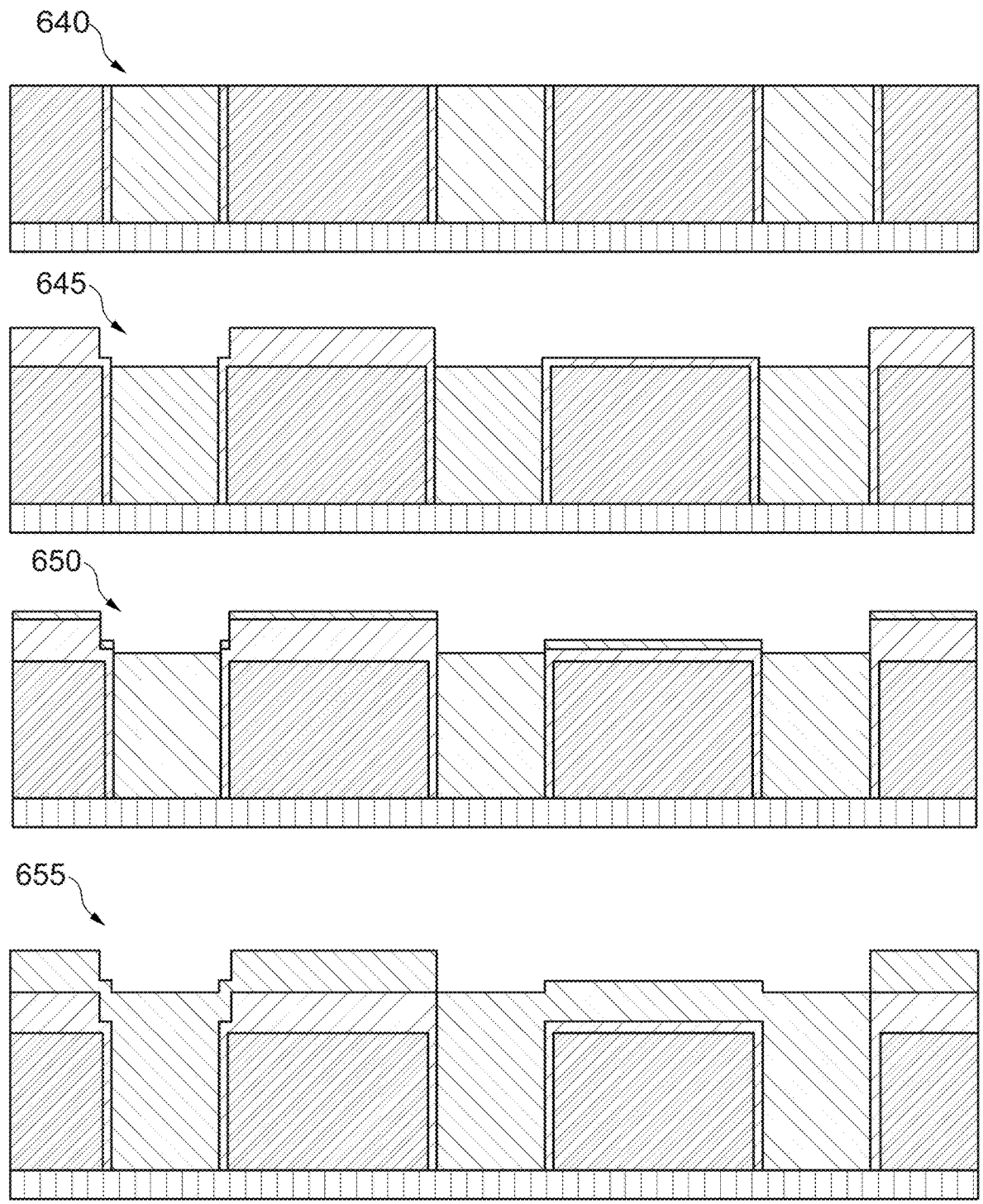
Fig. 6.3

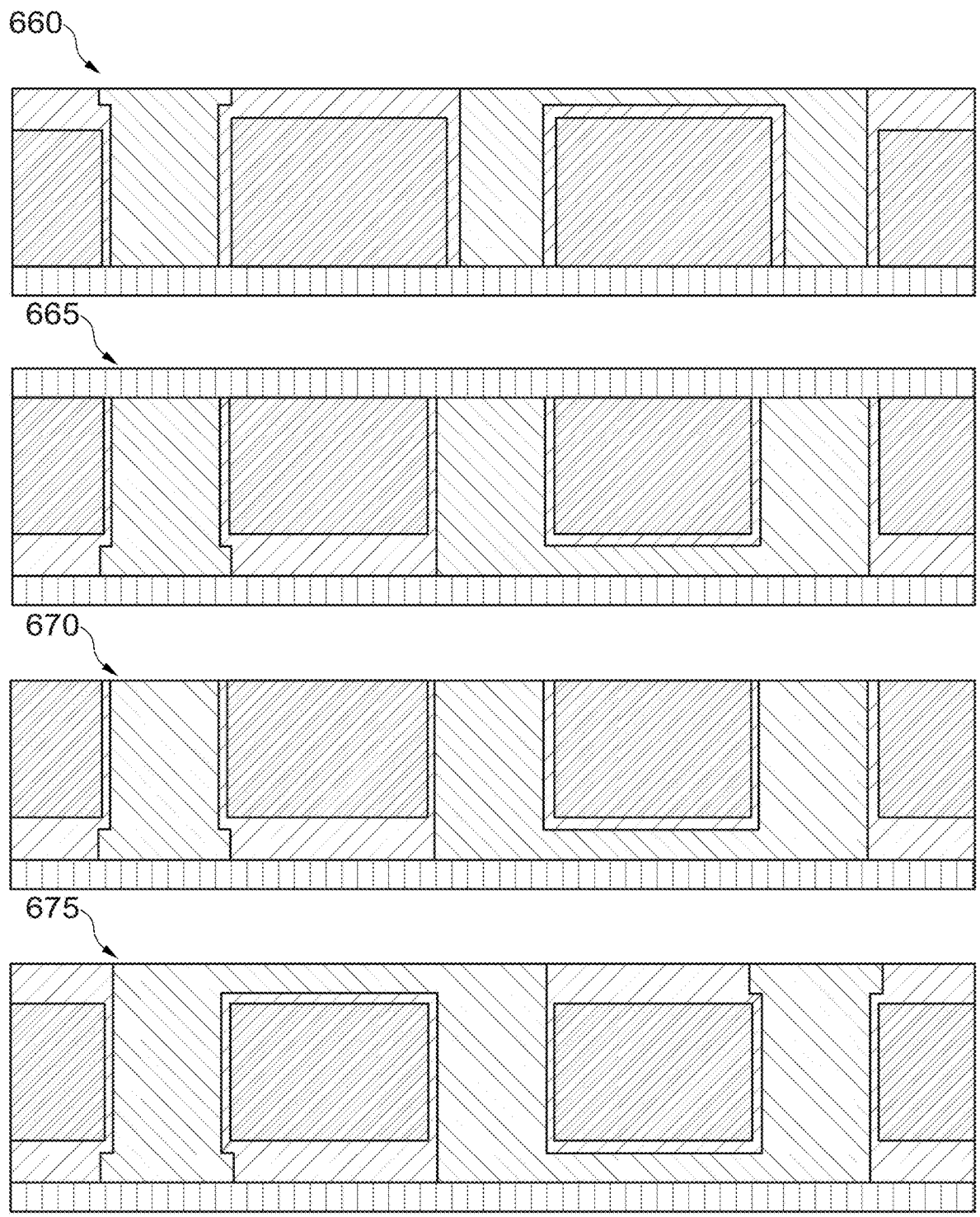
Fig. 6.4

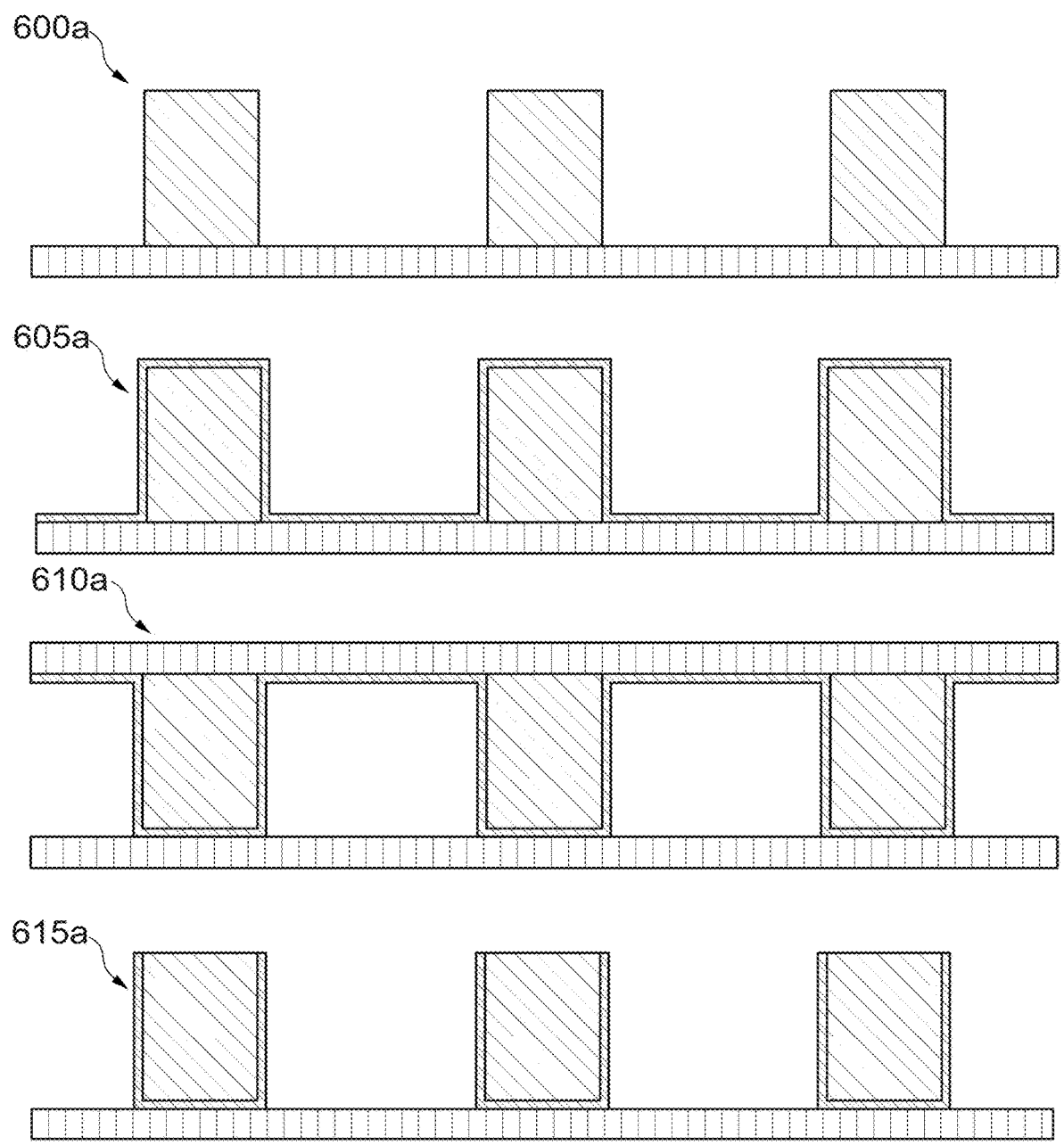
Fig. 6.5

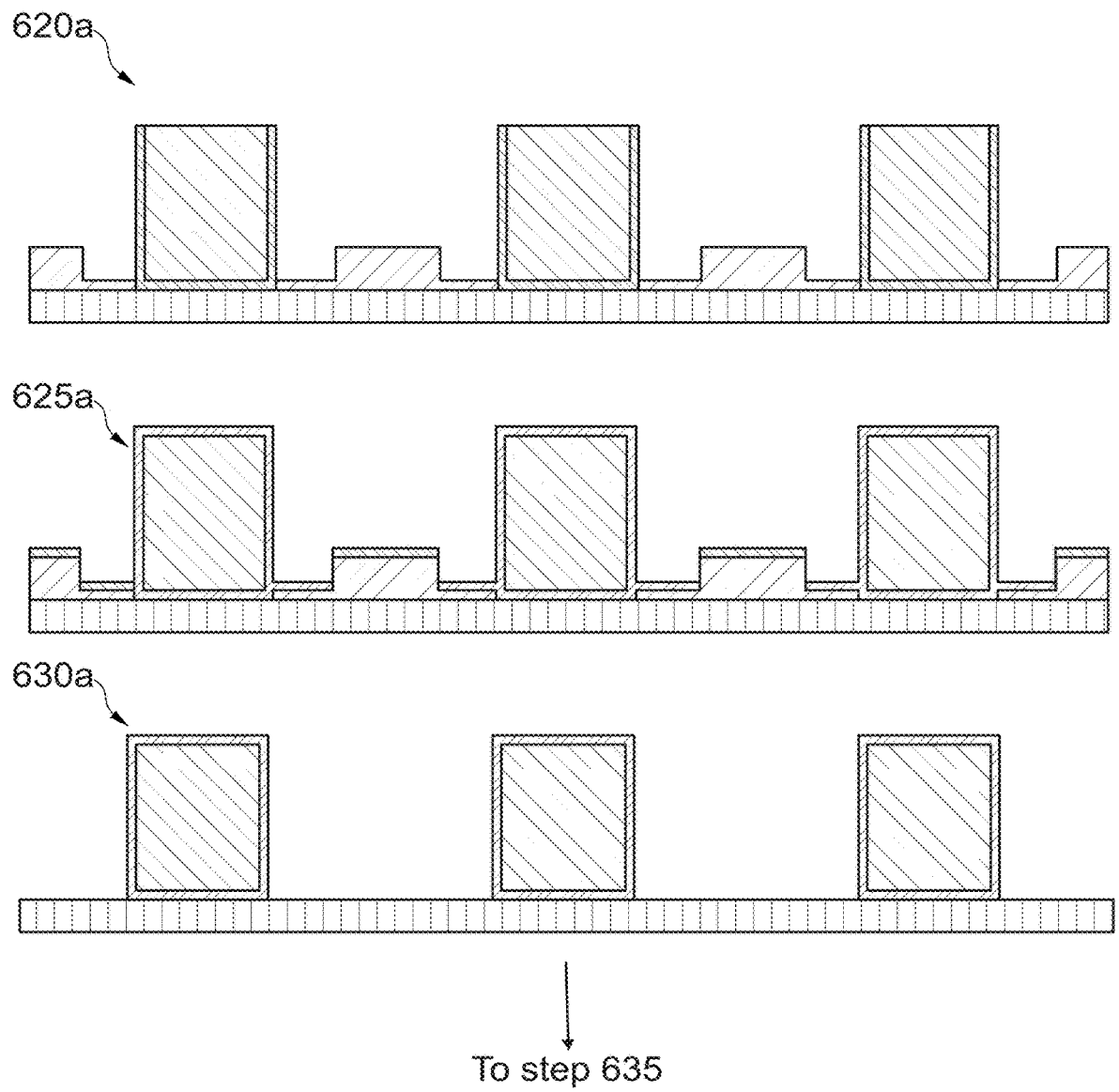
Fig. 6.6

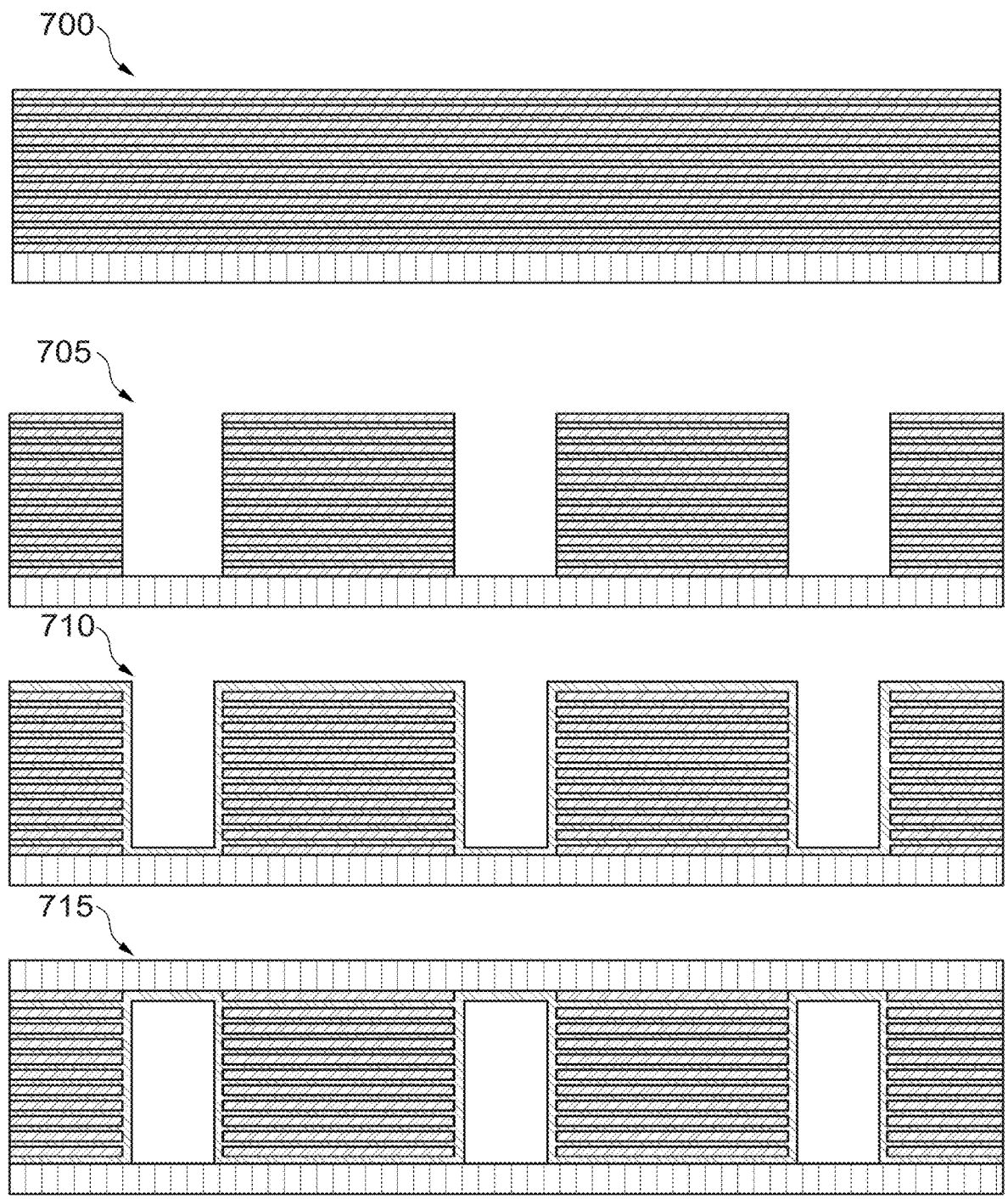
Fig. 7.1

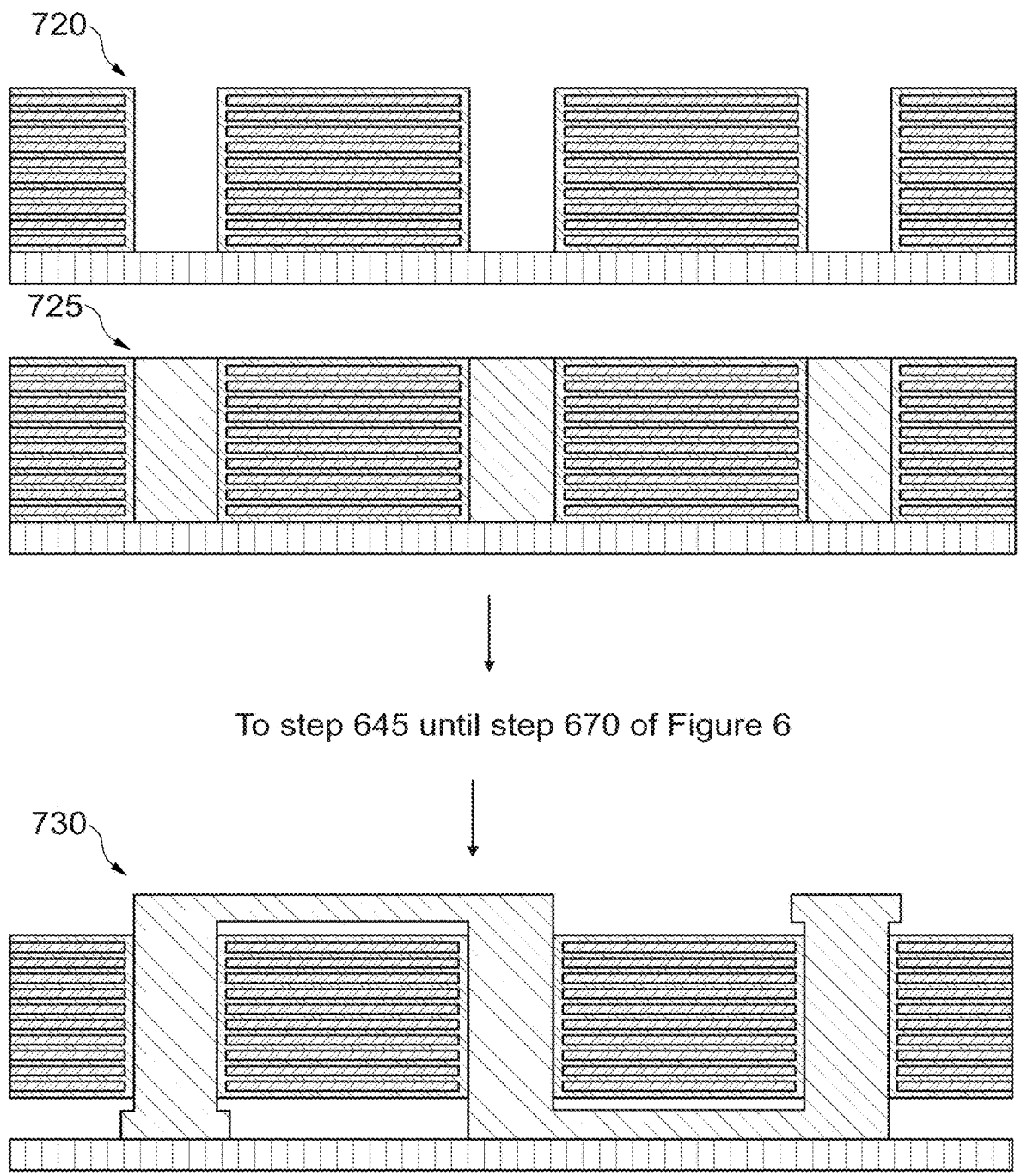
Fig. 7.2

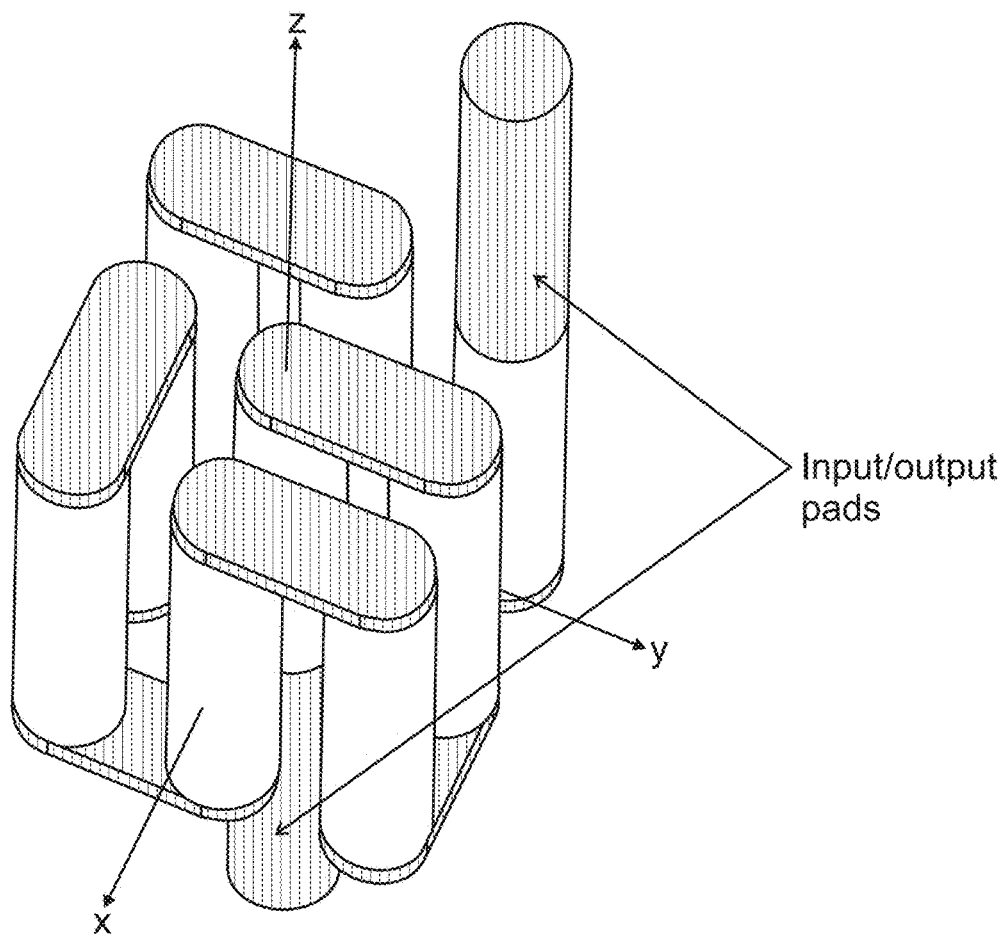
Pillar cross section - 90° angled view
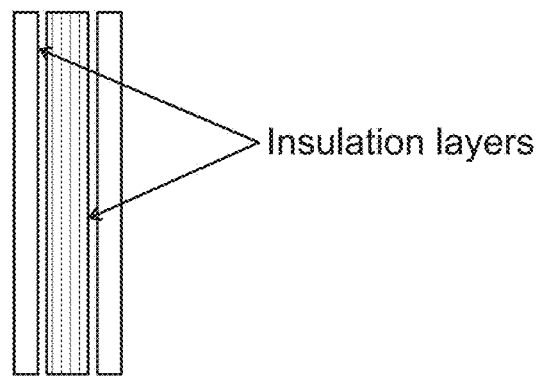
Fig. 8

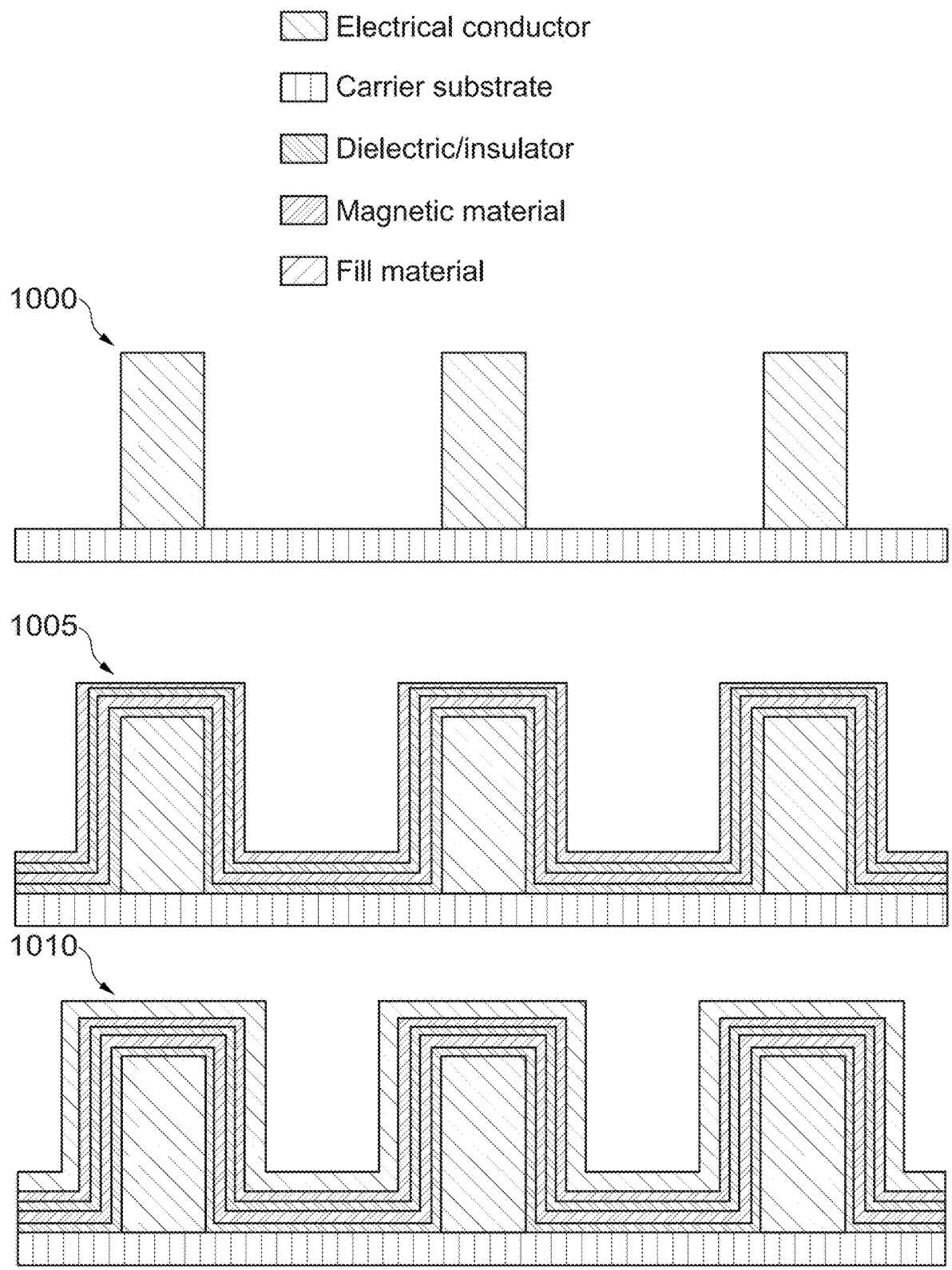
Fig. 10.1

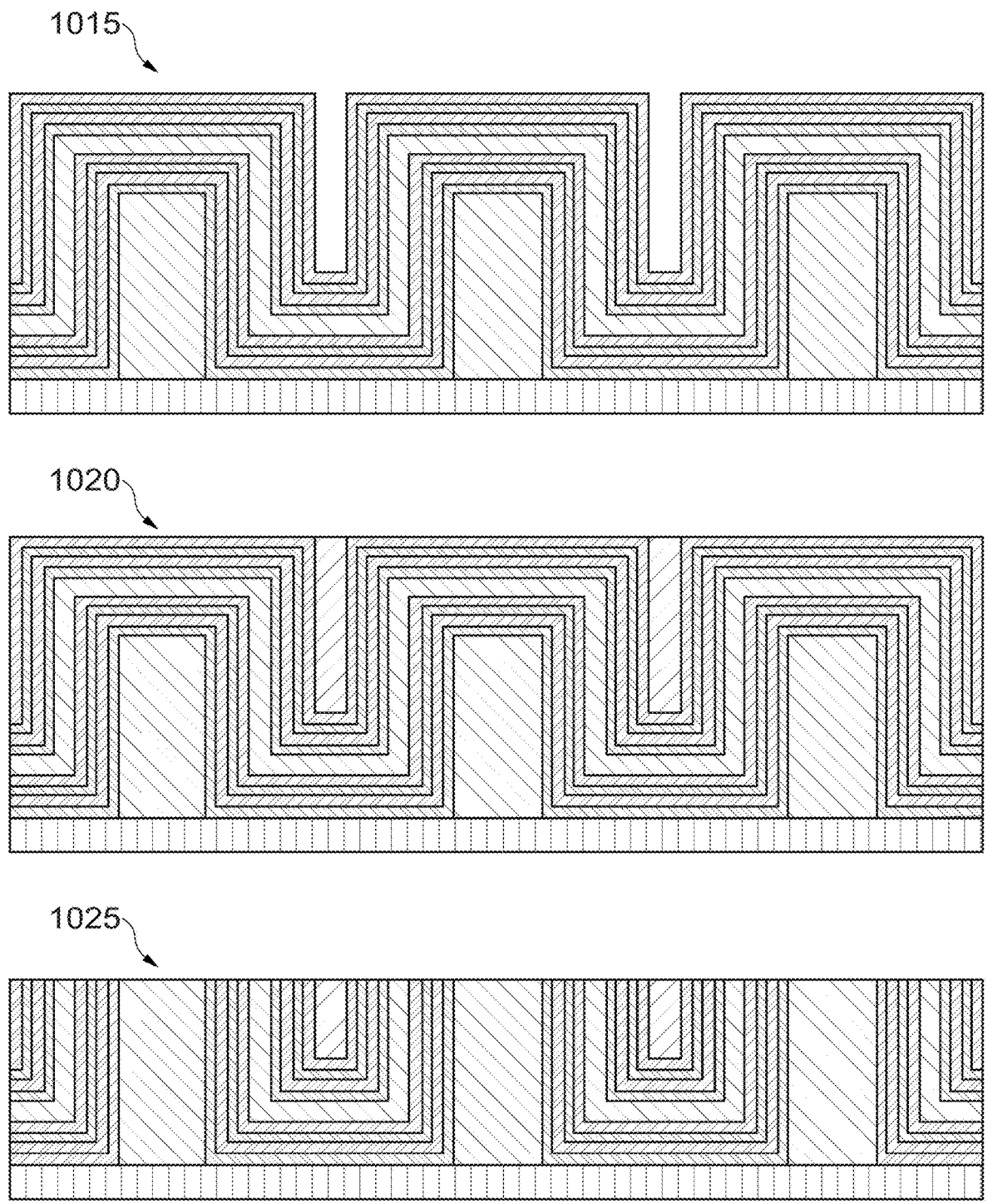
Fig. 10.2

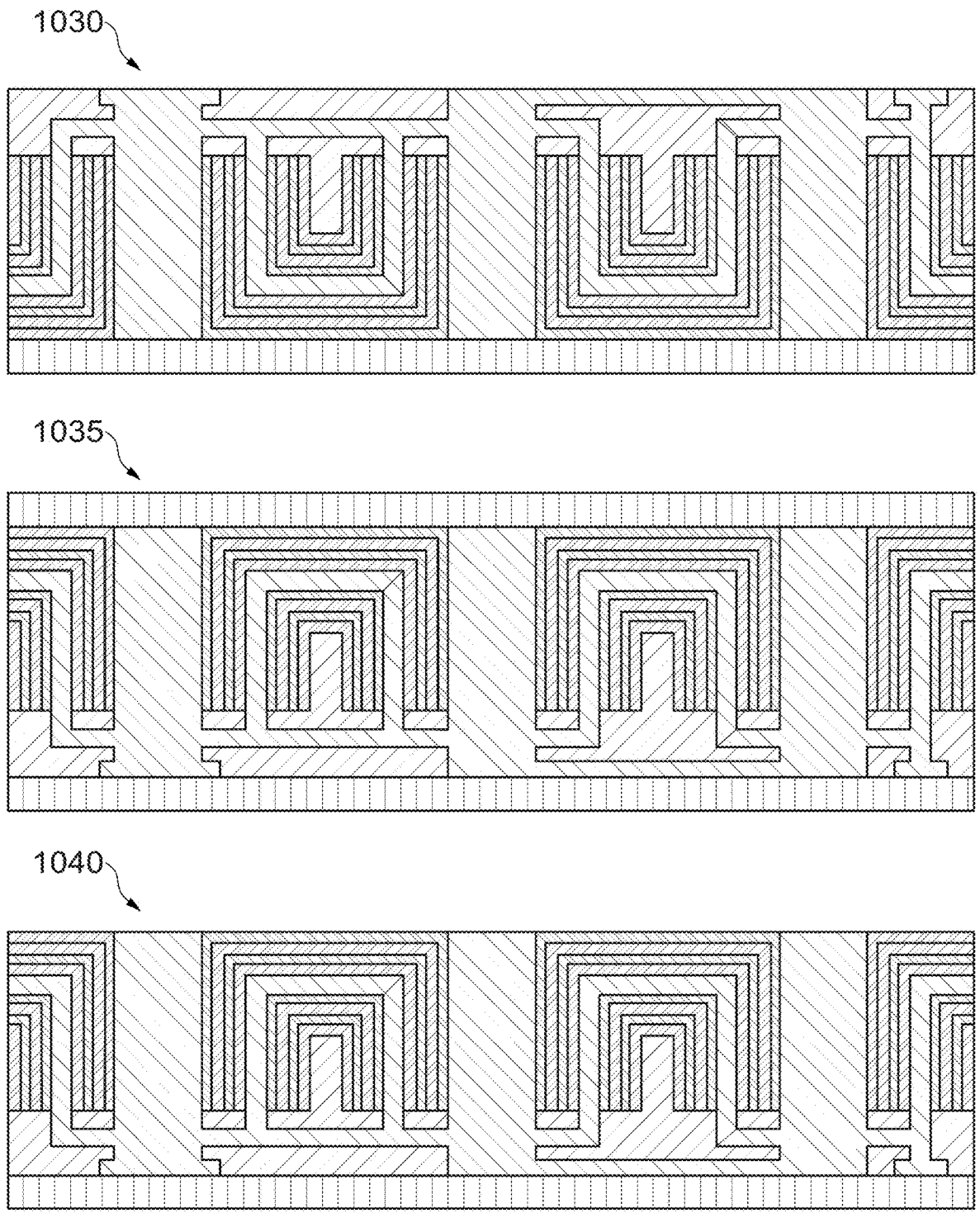
Fig. 10.3

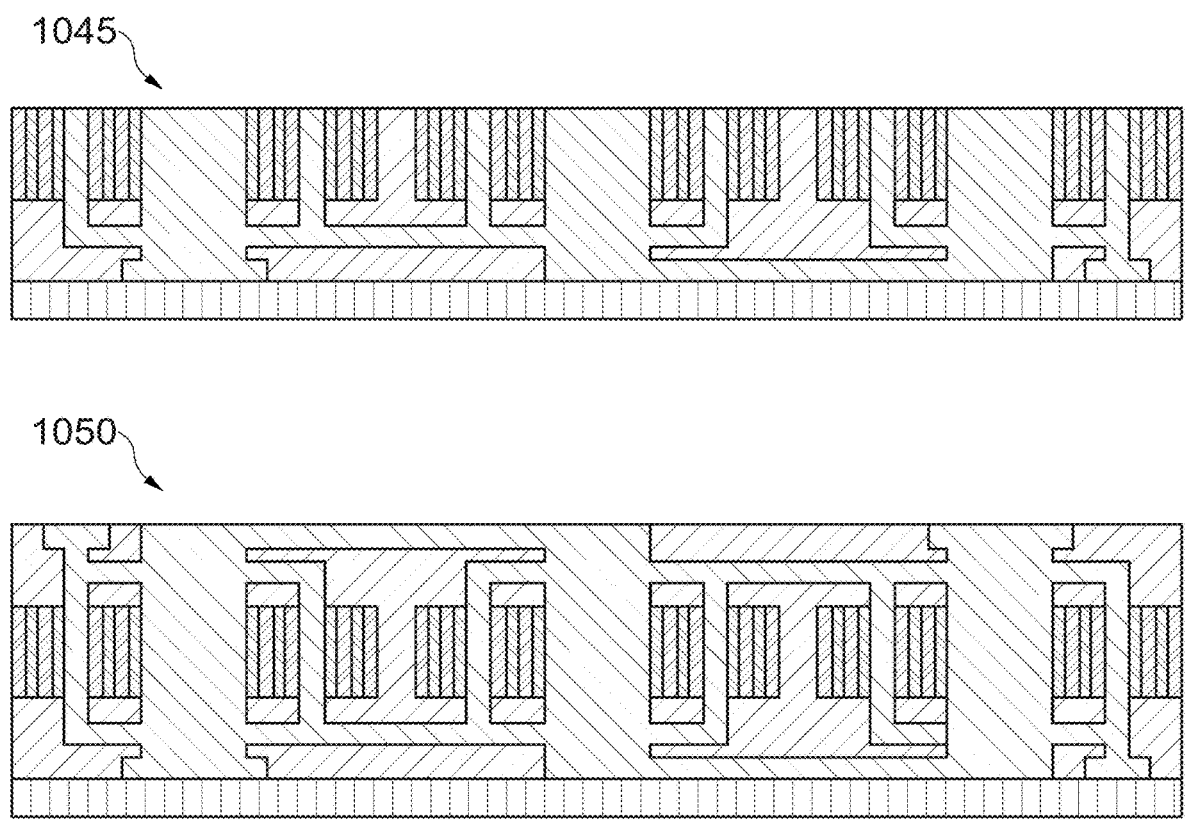
Fig. 10.4

VERTICAL MAGNETIC STRUCTURE FOR INTEGRATED POWER CONVERSION

CROSS REFERENCE TO RELATED APPLICATIONS

This is the national phase under 35 U.S.C. § 371 of International Application No. PCT/EP2019/077978 filed on Oct. 15, 2019, which claims priority to and the benefit of U.S. Provisional Application No. 62/745,901 filed on Oct. 15, 2018 and United Kingdom Patent Application No. 1816833.6 filed on Oct. 16, 2018, the entire disclosures of each of which are incorporated by reference herein.

FIELD

The present invention relates to inductors, coupled inductors and transformers in integrated power converters.

BACKGROUND

There are many different techniques which are currently being used to fabricate power supplies. Emerging solutions include power supply-in-package (PSiP) and power supply-on-chip (PwrSoC). One such technique is integrated voltage regulator (IVR) technology. IVR technology involves the integration of the power supply with the load either monolithically, in 2.5D/3D, in package or in substrate. IVRs improve the efficiency of power delivery, through elimination of parasitics and a faster transient response. Through miniaturization and integration of magnetic components, the technology removes the need for discrete and bulky magnetics, thereby dramatically reducing the form-factor and footprint of the power conversion circuitry. IVRs also provide the further advantage of a reduced requirement for decoupling capacitors. In addition, IVRs can provide power supply granularity, which can result in a significant increase in power system efficiency.

The major roadblock in realizing an ever increasing number of small integrated dc-dc switching regulators needed in microelectronics applications is due to the size (profile and footprint) of the magnetic passive components. Typically, the micro-fabricated magnetic passive components use four different types of planar structures, namely stripline, spiral, toroid and solenoid. These planar structures are typically fabricated using thin-film processing of magnetic cores and conductor windings.

It is an object of the present invention to provide an inductor structure which overcomes at least one of the above mentioned problems.

SUMMARY

According to one aspect of the invention there is provided, as set out in the appended claims, a transformer or a coupled inductor device comprising: two interconnected columns of conductive material embedded in a supporting structure, the two interconnected columns comprising a first column and a second column spaced apart from the first column, each column comprising an inner column portion and an outer column portion concentric with the inner column portion, the outer column portion and the inner column portion each having a first end and a second end, wherein the first end of the first inner column portion and the first outer column portion each comprise an input terminal or an output terminal and the first end of the second inner column portion and the second outer column portion each comprise an input terminal or an output terminal, and wherein the second end of the first inner column portion is conductively coupled to the second end of the second inner column portion by an inner interconnecting track of conductive material, and wherein the second end of the first outer column portion is conductively coupled to the second end of the second outer column portion by an outer interconnecting track of conductive material.

According to another aspect of the invention there is provided a transformer or a coupled inductor device comprising:

three or more interconnected spaced apart columns of conductive material embedded in a supporting structure, the three of more columns comprising an input column, an output column, and at least one intermediate column, each column comprising an inner column portion and an outer column portion concentric with the inner column portion, the outer column portion and the inner column portion each having a first end and a second end, wherein the first end of each intermediate inner column portion is conductively coupled to the first end of a first adjacent inner column portion by a first inner interconnecting track of conductive material and isolated from the first end of a second adjacent inner column portion, and the second end of each intermediate inner column portion is conductively coupled to the second end of the second adjacent inner column portion by a second inner interconnecting track of conductive material and isolated from the second end of the first adjacent inner column portion; and wherein the first end of each intermediate outer column portion is conductively coupled to the first end of a first adjacent outer column portion by a first outer interconnecting track of conductive material and isolated from the first end of a second adjacent outer column portion, and the second end of each intermediate outer column portion is conductively coupled to the second end of the second adjacent outer column portion by a second outer interconnecting track of conductive material and isolated from the second end of the first adjacent outer column portion;

wherein each end of an inner column portion and an outer column portion which is not connected to an intermediate column comprises an input terminal or an output terminal.

In one embodiment, the device further comprises a first magnetic layer surrounding each outer column portion.

In one embodiment, the device further comprises a second magnetic layer surrounding each inner column portion.

According to yet another aspect of the invention there is provided an inductor device comprising:

one or more interconnected columns of conductive material embedded in a supporting structure, wherein the one or more columns comprise an input terminal and an output terminal; and wherein each column is surrounded by a first magnetic layer.

In one embodiment, the device further comprises an intervening dielectric layer electrically isolating each column from its first magnetic layer.

In one embodiment, the device further comprises a single column, wherein the column comprises a first end and a second end, and wherein the first end comprises the input terminal and the second end comprises the output terminal.

In one embodiment, the device further comprises a first column and a second column spaced apart from the first column, each column comprising a first end and a second end; wherein the first end of the first column comprises the input terminal and the first end of the second column comprises the output terminal, and wherein the second end of the first column is interconnected to the second end of the second column by a track of conductive material.

In one embodiment, the device further comprises three or more spaced apart columns, the three or more columns comprising an input column, an output column, and at least one intermediate column, each column comprising a first end and a second end, and wherein the columns are interconnected at their ends by tracks of conductive material.

In one embodiment, the first end of each intermediate column is conductively coupled to the first end of a first adjacent column by a first interconnecting track of conductive material and isolated from the first end of a second adjacent column, and the second end of each intermediate column is conductively coupled to the second end of the second adjacent column by a second interconnecting track of conductive material and isolated from the second end of the first adjacent column, and wherein the end of the input column which is not connected to an intermediate column comprises the input terminal and the end of the output column which is not connected to an intermediate column comprises the output terminal.

In one embodiment, the device comprises a single column comprising an inner column portion and an outer column portion concentric with the inner column portion, the outer column portion and the inner column portion each having a first end and a second end, wherein the first end of the inner column portion and the outer column portion each comprise an input terminal and the second end of the inner column portion and the outer column portion each comprise an output terminal, wherein the inner column portion and the outer column portion are separated by an insulation layer.

In one embodiment, the device comprises a first column and a second column spaced apart from the first column, each column comprising an inner column portion and an outer column portion concentric with the inner column portion, the outer column portion and the inner column portion each having a first end and a second end, wherein the first end of the first inner column portion and the first outer column portion each comprise an input terminal or an output terminal and the first end of the second inner column portion and the second outer column portion each comprise an input terminal or an output terminal, and wherein the second end of the first inner column portion is conductively coupled to the second end of the second inner column portion by an inner interconnecting track of conductive material, and wherein the second end of the first outer column portion is conductively coupled to the second end of the second outer column portion by an outer interconnecting track of conductive material.

In one embodiment, the device comprises three or more spaced apart columns, the three of more columns comprising an input column, an output column, and at least one intermediate column, each column comprising an inner column portion and an outer column portion concentric with the inner column portion, the outer column portion and the inner column portion each having a first end and a second end, wherein the first end of each intermediate inner column portion is conductively coupled to the first end of a first adjacent inner column portion by a first inner interconnecting track of conductive material and isolated from the first end of a second adjacent inner column portion, and the second end of each intermediate inner column portion is conductively coupled to the second end of the second adjacent inner column portion by a second inner interconnecting track of conductive material and isolated from the second end of the first adjacent inner column portion; and wherein the first end of each intermediate outer column portion is conductively coupled to the first end of a first adjacent outer column portion by a first outer interconnecting track of conductive material and isolated from the first end of a second adjacent outer column portion, and the second end of each intermediate outer column portion is conductively coupled to the second end of the second adjacent outer column portion by a second outer interconnecting track of conductive material and isolated from the second end of the first adjacent outer column portion; and wherein each end of an inner column portion and an outer column portion which is not connected to an intermediate column comprises an input terminal or an output terminal.

In one embodiment, the device further comprises a second magnetic layer provided between each inner column portion and outer column portion.

In one embodiment, the degree of coupling between the inner column portion and the outer column portion is tuned by varying the thickness of the first and/or second magnetic layers.

In one embodiment, the second magnetic layer comprises a plurality of vertical laminations comprising alternating magnetic and dielectric layers.

In one embodiment, the first magnetic layer comprises a plurality of vertical laminations comprising alternating magnetic and dielectric layers.

In one embodiment, the supporting structure comprises a non-conductive and non-magnetic material.

In one embodiment, the supporting structure comprises the first magnetic layer.

In one embodiment, the first magnetic layer comprises magnetic particles suspended in a polymer matrix.

In one embodiment, the first magnetic layer and/or the second magnetic layer comprise magnetic particles suspended in a polymer matrix.

In one embodiment, the first magnetic layer comprises a plurality of rings of magnetic material, each column surrounded by one ring, and further comprising an insulation layer between each of the rings.

In one embodiment, the rings are arranged in a hexagonally-packed topology.

In one embodiment, the rings are arranged in a square-packed topology.

In one embodiment, the first magnetic layer comprises a plurality of horizontal laminations comprising alternating magnetic and dielectric layers.

In one embodiment, the supporting structure and the columns together comprise an interposer.

In one embodiment, the supporting structure and the columns together comprise a printed circuit board.

In one embodiment, the supporting structure and the columns together comprise a functional substrate.

In one embodiment, the tracks of conductive material are on the surface of the supporting structure.

In one embodiment, the tracks of conductive material are embedded in the supporting structure.

In one embodiment, the tracks of conductive material are coated with a magnetic material.

In one embodiment, a partial coating of the magnetic material is provided beneath and/or over the tracks of conductive material.

In one embodiment, the magnetic material is electrically isolated from the tracks of conductive material by an intervening dielectric layer.

In one embodiment, the magnetic material has in-plane magnetic anisotropy in the X-Y plane.

In one embodiment, the magnetic material comprises horizontal laminations with intervening dielectric layers.

In one embodiment, one or more of the magnetic layers have in-plane magnetic anisotropy in the Z plane, making a vertical easy-axis and an annular hard-axis.

In one embodiment, the first magnetic layer and/or the second magnetic layer have magnetic anisotropy such that the hard-axis is oriented circumferentially to the columns.

This arrangement boosts the inductance of the device at high frequency.

In one embodiment, each column is solid.

In one embodiment, each column is hollow.

In one embodiment, the inductor device comprises one of: an inductor, a coupled inductor, a transformer, or a magnetic sensor.

In one embodiment, the device further comprises a support substrate.

In another embodiment there is provided a method for fabricating an inductor device comprising the steps of:
  depositing one or more columns of conductive material on a first support substrate, the one or more columns comprising an input terminal and an output terminal;
  depositing a first magnetic layer around each column;
  depositing a fill material around and between each column to create a supporting structure; and
  depositing an input pad on the input terminal and an output pad on the output terminal.

In one embodiment, the inductor device comprises a single column comprising a first end and a second end,
  wherein the step of depositing an input pad on the input terminal and an output pad on the output terminal comprises depositing an input pad on the first end and depositing an output pad on the second end.

In one embodiment, the inductor device comprises a first column and a second column spaced apart from the first column, each column comprising a first end and a second end,
  wherein the step of depositing an input pad on the input terminal and an output pad on the output terminal comprises depositing an input pad on the first end of the first column and depositing an output pad on the first end of the second column; and wherein the method further comprises the step of:
  interconnecting the second end of the first column to the second end of the second column by a track of conductive material.

In one embodiment, the inductor device comprises three or more spaced apart columns, the three of more columns comprising an input column, an output column and at least one intermediate column, each column comprising a first end and a second end, wherein the method further comprises the step of interconnecting the columns by the steps of:
  depositing a first set of tracks of conductive material such that the first end of each intermediate column is conductively coupled to the first end of a first adjacent column and not coupled to the first end of a second adjacent column;
  and depositing a second set of tracks of conductive material such that the second end of each intermediate column is conductively coupled to the second end of a second adjacent column and not coupled to the second end of the first adjacent column; and
  wherein the step of depositing an input pad on the input terminal and an output pad on the output terminal comprises depositing an input pad on the end of the input column which is not connected to an intermediate column and depositing an output pad on the end of the output column which is not connected to an intermediate column.

In one embodiment, the step of depositing a first magnetic layer around each column comprises the steps of:
  coating the exposed surfaces of the columns and the first support substrate with a magnetic layer such that the magnetic layer extends along the first end of each column, distal to the first support substrate, along the vertical surface of each column, and along the surface of the first support substrate in between each column.

In one embodiment, the method further comprises:
  planarizing the surface of the supporting structure to remove the first magnetic layer deposited on the first end of each column.

In one embodiment, the method further comprises the steps of:
  after performing the step of depositing the first set of tracks of conductive material, mounting a second support substrate to the first set of tracks of conductive material;
  inverting the supporting structure;
  removing the first support substrate;
  planarizing the surface of the second end of each column to remove the first magnetic layer that extends between the columns; and
  performing the step of depositing the second set of tracks of conductive material.

In one embodiment, the method further comprises prior to depositing a fill material around and between each column to create a supporting structure, performing the steps of:
  coating the exposed surfaces of the first magnetic layer with a second layer of conductive material such that the second layer of conductive material is on the first magnetic layer that extends along the first end of each column, distal to the first support substrate, along the vertical surface of the columns, and along the surface of the first support substrate in between the columns; and
  depositing a second layer of magnetic material on the second layer of conductive material such that the second layer of magnetic material extends the length of the second layer of conductive material;
  such that each column comprises an inner column portion and a concentric outer column portion, wherein the inner column portion and the outer column portion are separated by an insulation layer;
  and wherein the step of depositing the first set of tracks of conductive material is such that:
  the first end of each intermediate inner column portion is conductively coupled to the first end of a first adjacent inner column portion by a first inner interconnecting track of conductive material and isolated from the first end of a second adjacent inner column portion, and the first end of each intermediate outer column portion is conductively coupled to the first end of a first adjacent outer column portion by a first outer interconnecting track of conductive material and isolated from the first end of a second adjacent outer column portion; and
  wherein the step of depositing the second set of tracks of conductive material is such that:
  the second end of each intermediate inner column portion is conductively coupled to the second end of the second adjacent inner column portion by a second inner interconnecting track of conductive material and isolated from the second end of the first adjacent inner column portion; and the second end of each intermediate outer column portion is conductively coupled to the second end of the second adjacent outer column portion by a second outer interconnecting track of conductive material and isolated from the second end of the first adjacent outer column portion; and wherein each end of an inner column portion and an outer column portion which is not connected to an intermediate column comprises an input terminal or an output terminal.

In one embodiment, the method further comprises removing the second support substrate.

In one embodiment, the method further comprises prior to depositing the columns of conductive material on a first support substrate, performing the steps of:
depositing a plurality of spaced apart lengths of a first insulating material on the first support substrate;
depositing the first set of tracks of conductive material, wherein the tracks are deposited on those portions of the first support substrate which are not in contact with the spaced apart lengths of the first insulating material; and
depositing a plurality of spaced apart columns of the first insulating material on the spaced apart lengths of the first insulating material and on selective portions of the first set of tracks of conductive material.

In one embodiment, the method further comprises depositing the input or output pad while depositing the first set of tracks of conductive material.

In one embodiment, the method further comprises prior to depositing the first magnetic layer performing the steps of:
removing the first insulating material; and
depositing a second insulating material on the planar surfaces of the columns and the first support substrate; and
wherein the step of depositing the first magnetic layer around each column comprises coating the exposed vertical surface of the columns with the first magnetic layer.

In one embodiment, the method further comprises removing the second insulating material from the planar surface of the columns; and performing the step of depositing the second set of tracks of conductive material.

In one embodiment, the method further comprises removing the second support substrate.

In one embodiment, the magnetic layers comprise a plurality of vertical laminations comprising alternating magnetic and dielectric layers.

In one embodiment, the method further comprises prior to depositing the first magnetic layer around each column performing the steps of:
coating the exposed surfaces of the columns with a layer of insulating material that extends along the first end of each column, distal to the support substrate, and also along the vertical surface of the columns; and
wherein the step of depositing a fill material around and between each column to create a supporting structure comprises depositing the first magnetic layer around and between each column such that it extends continuously from column to column.

In one embodiment, the method further comprises:
etching the first magnetic layer into separate rings concentric to each column, where the etched voids vertically extend from the top of the first magnetic layer to the surface of the first support substrate; and
filling the etched voids with a dielectric material.

In one embodiment, the method further comprises the steps of:
removing the insulating material from the planar surface of the columns;
performing the step of depositing the first set of tracks of conductive material;
mounting a second support substrate to the first set of tracks of conductive material;
inverting the supporting structure;
removing the first support substrate; and
performing the step of depositing the second set of tracks of conductive material.

In one embodiment, the method further comprises coating the tracks of conductive material with magnetic material.

In one embodiment, the method further comprises providing a partial coating of the magnetic material beneath and/or over the tracks of conductive material.

In one embodiment, the method further comprises electrically isolating the magnetic material from the tracks of conductive material by an intervening dielectric layer.

In one embodiment, the magnetic material is deposited in the presence of a magnetic field and has in-plane magnetic anisotropy in the X-Y plane.

In one embodiment, the magnetic material comprises horizontal laminations with intervening dielectrics in between.

In one embodiment, the one or more magnetic layers are deposited in the presence of a magnetic field, which induces magnetic anisotropy in either the X-Y and/or the Z planes.

In another embodiment there is provided a method for fabricating an inductor device comprising the steps of:
depositing a magnetic layer on a first support substrate to create a supporting structure; embedding one or more columns of conductive material in the magnetic layer, the one or more columns comprising an input terminal and an output terminal; depositing an input pad on the input terminal and an output pad on the output terminal.

In one embodiment, the inductor device comprises a single column comprising a first end and a second end,
wherein the step of depositing an input pad on the input column and an output pad on the output column comprises depositing an input pad on the first end and depositing an output pad on the second end.

In one embodiment, the inductor device comprises a first column and a second column spaced apart from the first column, each column comprising a first end and a second end,
wherein the step of depositing an input pad on the input column and an output pad on the output column comprises depositing an input pad on the first end of the first column and depositing an output pad on the first end of the second column; and wherein the method further comprises the step of:
interconnecting the second end of the first column to the second end of the second column by a track of conductive material.

In one embodiment, the inductor device comprises three or more spaced apart columns, the three of more columns comprising an input column, an output column and at least one intermediate column, each column comprising a first end and a second end, wherein the method further comprises the step of interconnecting the columns by the steps of:
depositing a first set of tracks of conductive material such that the first end of each intermediate column is conductively coupled to the first end of a first adjacent column and not coupled to the first end of a second adjacent column; and depositing a second set of tracks of conductive material such that the second end of each intermediate column is conductively coupled to the second end of a second adjacent column and not coupled to the second end of the first adjacent column; and wherein the step of depositing an input pad on the input column and an output pad on the output column comprises depositing an input pad on the end of the input column which is not connected to an intermediate column and depositing an output pad on the end of the output column which is not connected to an intermediate column.

In one embodiment, the method further comprises prior to the step of embedding the columns of conductive material in the magnetic layer;

etching the magnetic layer into discrete columns of magnetic material, with etched voids in between the columns of magnetic material and columnar voids in the centre of and concentric with each column of magnetic material, wherein the voids vertically extend from the top of the magnetic layer to the surface of the first support substrate;

filling the etched voids with a dielectric material;

coating the exposed surfaces of the columns of magnetic material and the first support substrate with a first layer of insulating material that extends along the first end of each column of magnetic material, distal to the support substrate, along the vertical surface of the columns of magnetic material, and along the surface of the first support substrate in the columnar voids concentric with the columns of magnetic material;

mounting a second support substrate to the first end of the columns of magnetic material; inverting the supporting structure;

removing the first support substrate; and wherein the step of embedding the columns of conductive material in the magnetic layer comprises depositing the columns of conductive material in the columnar voids in the centre of and concentric with the columns of magnetic material.

In one embodiment, the magnetic layer extends continuously from column to column of conductive material, the method further comprising prior to the step of embedding the columns of conductive material in the magnetic layer;

etching the magnetic layer to form columnar voids, wherein the voids vertically extend from the top of the magnetic layer to the surface of the first support substrate;

coating the exposed surfaces of the magnetic material and the first support substrate with a first layer of insulating material that extends along the end of the magnetic material distal to the support substrate, along the vertical surface of the magnetic material, and along the surface of the first support substrate in the columnar voids;

mounting a second support substrate to the first end of the magnetic material; inverting the supporting structure;

removing the first support substrate; and wherein the step of embedding the columns of conductive material in the magnetic layer comprises depositing the columns of conductive material in the columnar voids.

In one embodiment, the magnetic layer comprises a plurality of horizontal laminations comprising alternating magnetic and dielectric layers; and wherein if the top surface of the magnetic layer is not a dielectric, depositing a second layer of insulating material on the exposed second end of the magnetic material prior to embedding the columns of conductive material in the magnetic layer.

In one embodiment, the method further comprises prior to embedding the columns of conductive material in the magnetic core, depositing a second layer of insulating material on the exposed second end of the magnetic material.

In one embodiment, the method further comprises:
performing the step of depositing the first set of tracks of conductive material; mounting a third support substrate to the first set of tracks of conductive material;
inverting the supporting structure;
removing the second support substrate; and
performing the step of depositing the second set of tracks of conductive material.

In one embodiment, the method further comprises:
coating the tracks of conductive material with a magnetic material.

In one embodiment, the method further comprises:
providing a partial coating of the magnetic material beneath and/or over the tracks of conductive material.

In one embodiment, the method further comprises:
electrically isolating the magnetic material from the tracks of conductive material by an intervening dielectric layer.

In one embodiment, the magnetic material comprises horizontal laminations with intervening dielectrics in between.

In one embodiment, one or more of the magnetic layers are deposited in the presence of a magnetic field, which induces magnetic anisotropy in either the X-Y and/or the Z planes.

In yet another aspect of the invention there is provided an inductor device comprising:
at least two interconnected columns of conductive material embedded in a supporting structure, wherein the columns are interconnected by tracks of conductive material, wherein the at least two columns comprise an input terminal and an output terminal; and wherein each column is surrounded by a first magnetic layer.

In one embodiment, the supporting structure comprises a non-semiconductive, non-glass, non-PCB material.

In one embodiment, the supporting structure comprises the tracks of conductive material.

In one embodiment, the supporting structure comprises a magnetic material.

In one embodiment, the supporting structure comprises a non-conductive and non-magnetic material.

In one embodiment, the supporting structure comprises a non-conductive and non-magnetic material and the tracks of conductive material.

In one embodiment, the at least two interconnected columns of conductive material embedded in the supporting structure are separated by an interstitial medium.

In one embodiment, the interstitial medium comprises a gas.

In one embodiment, the interstitial medium comprises a magnetic material.

In one embodiment, the interstitial medium comprises a non-conductive and non-magnetic material.

In one embodiment, the first magnetic layer comprises a plurality of rings of magnetic material, each column surrounded by one ring, and further comprising an insulation layer between each of the rings.

In one embodiment, each column is solid.

In one embodiment, each column is hollow.

In one embodiment, each column comprises an inner column portion and an outer column portion concentric with the inner column portion, wherein the first magnetic layer surrounds each outer column portion and a second magnetic layer surrounds each inner column portion.

In one embodiment, the first magnetic layer and/or the second magnetic layer comprise a plurality of vertical laminations comprising alternating magnetic and dielectric layers.

In one embodiment, the coupling factor between the columns of conductive material is tuneable by adjusting the width of the dielectric layer.

In one embodiment, the supporting structure comprises the first magnetic layer; and wherein the first and/or second magnetic layer comprise magnetic particles suspended in a polymer matrix.

In one embodiment, the first magnetic layer and/or the second magnetic layer have magnetic anisotropy such that the hard-axis is oriented circumferentially to the columns.

In one embodiment, the magnetic anisotropy is a function of the aspect ratio of the columns of conductive material.

In one embodiment, the inductor device comprises a discrete, self-supporting device.

BRIEF DESCRIPTION OF THE DRAWINGS

The invention will be more clearly understood from the following description of an embodiment thereof, given by way of example only, with reference to the accompanying drawings, in which:—

FIG. 3 shows a detailed schematic of one fabrication process of the vertical magnetic structure of the inductor device shown in FIG. 1b;

FIG. 4 shows a detailed schematic of another fabrication process of the vertical magnetic structure of the inductor device shown in FIG. 1b;

FIG. 5 shows four alternative embodiments of the inductor device of the present invention;

FIG. 6 shows a detailed schematic of an embodiment of the fabrication process to obtain the vertical magnetic structure of the inductor device shown in FIG. 5b;

FIG. 7 shows a detailed schematic of an embodiment of the fabrication process to obtain the vertical magnetic structure of the inductor device shown FIG. 5d;

FIG. 8 shows a 3D view of the inductor device of FIG. 1a;

FIG. 15 shows a further embodiment of the inductor device of FIG. 5a;

DETAILED DESCRIPTION OF THE DRAWINGS

The present invention comprises an inductor device in the form of a vertical magnetic structure for an integrated power converter. The inductor device comprises one or more columns of conductive material embedded in a supporting structure, wherein the one or more columns comprise an input terminal and an output terminal. Each column is surrounded by a magnetic layer.

Figure 1A:
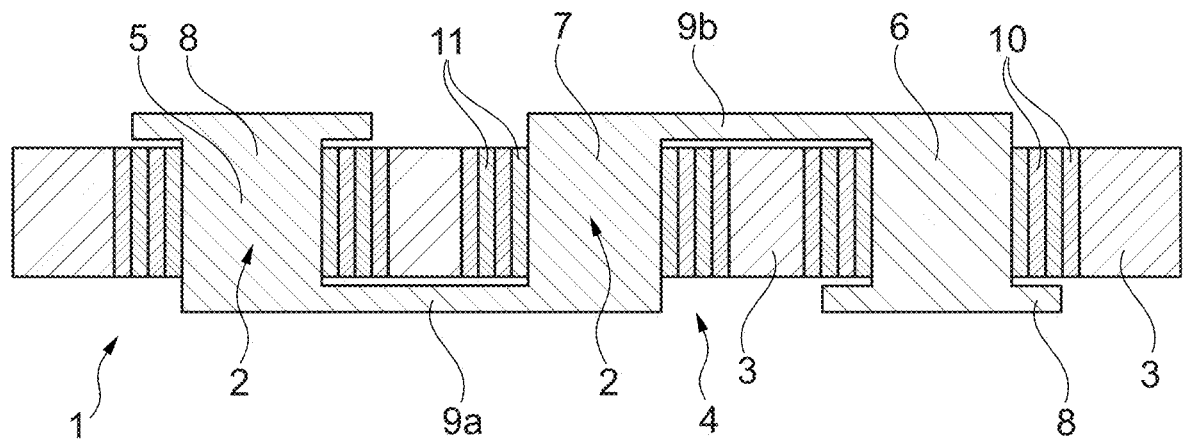
FIG. 1a shows one embodiment of the inductor device of the present invention.

One embodiment of the inductor device of the invention is shown in FIG. 1a. In this embodiment, the inductor device 1 comprises three columns 2 of conductive material embedded in a supporting structure 3, with a magnetic layer in the form of a magnetic core 4 surrounding each column 2. The columns comprise an input column 5, an output column 6, and an intermediate column 7. An input/output pad 8 is connected to the input column to form the input terminal of the inductor and an input/output pad 8 is connected to the output column to form the output terminal of the inductor. The columns are alternately interconnected at their ends by means of conductive tracks. In the embodiment shown, a first set of tracks 9a extend along the bottom surface of the supporting structure 3 and a second set of tracks 9b extend along the top surface of the supporting structure 3. However, in other embodiments, the tracks can be embedded inside the supporting structure.

In the embodiment of FIG. 1a, the magnetic core 4 comprises alternating layers of magnetic 10 and dielectric materials 11, where the core itself has the quality of being either magnetically isotropic or magnetically anisotropic. As is shown in FIG. 1a, the inductor device has been released from an underlying support substrate, wherein it will be appreciated that this quality may be attributed to any other embodiment of the invention. In one embodiment of the invention, the magnetic core is in the form of a vertically-oriented laminated thin film composed of a soft magnetic alloy, where the laminations have in-plane magnetic anisotropy with an easy-axis in the vertical direction.

The magnetic core 4 and the columns 2 both may be deposited by any suitable means and may also comprise any suitable materials. Some suitable deposition methods are chemical vapour deposition (CVD), physical vapour deposition (PVD) and electrodeposition. Some suitable magnetic materials are CZT, CZTB, FINEMET, CoP, NiFe and CoNiFe. Some suitable dielectric materials are AlN, SiO2, Si3N4, Si2N2O, SiC, Si, SiLK, polyimide, parylene, benzocyclobutene (BCB), polybenzoxazole (PBO), tetraethylorthosilicate (TEOS), fluorinated TEOS (FTEOS), doped glass (BPSG, PSG, BSG), organo-silicate glass (OSG), fluorinated glass (FSG), spin-on glass (SOG) and Al2O3. Some suitable conductive materials are Cu, Al, Ag and Au.

It will be appreciated that any number of columns 2 may be embedded in the supporting structure 3, depending on the requirements of the circuitry with which the inductor device is to be used. In embodiments where the inductor device comprises more than three columns, the vertical magnetic structure comprises a single input column to which the input/output pad forming the input terminal is connected at one end, a single output column to which the input/output pad forming the output terminal is connected at one end, and a plurality of intermediate columns. Where the inductor device comprises two columns, the vertical magnetic structure simply comprises an input column and an output column. The input/output pad forming the input terminal is then connected to one end of the input column and the input/output pad forming the output terminal is connected to the same end of the output column. Where the inductor device comprises only one column, the input/output pads forming the respective input and output terminals are connected to opposite ends of the same column.

As previously mentioned, the columns of conductive material are alternately connected with interconnecting tracks of conductive material. In the embodiment where the inductor device comprises three or more columns, this is achieved by a first end of each intermediate column being conductively coupled to a first end of a first adjacent column and isolated from a first end of a second adjacent column and a second end of each intermediate column being conductively coupled to a second end of a second adjacent column and not coupled to a second end of the first adjacent column. The I/O pad for wire bonding/flip chip is then connected to the end of the input column and the end of the output column that is not connected to an intermediate column.

Figure 1B:
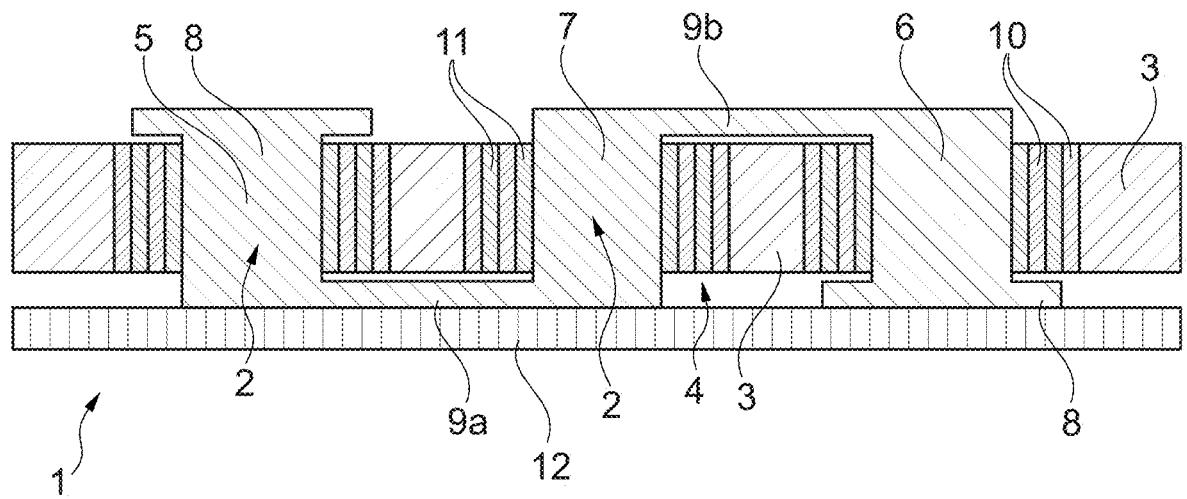
FIG. 1b shows another embodiment of the inductor device of the present invention.

FIG. 1b shows another embodiment of the inductor device of the present invention. This embodiment comprises the same features as FIG. 1a, except that it further includes a support substrate 12 coupled to the first set of tracks 9a of conductive material. The supporting structure 3 of the embodiment of FIG. 1b comprises a passivation layer. The passivation layer comprises a non-conductive and non-magnetic material. One example of such a material is a photoresist such as SU-8, or any light-sensitive material used in lithography. The supporting structure and the columns together may comprise a PCB, a functional substrate, a package or an interposer. The supporting structure may comprise any suitable magnetic material, such as ferrite or NiFe.

In one embodiment of the invention, the first and second interconnecting tracks of conductive material are coated with a magnetic material. This magnetic material may comprise alternating laminations of any suitable magnetic and dielectric materials. This coating can be achieved in a number of different ways. In a first embodiment, the coating of magnetic material completely wraps the tracks, forming a closed core. In a second embodiment, the magnetic material partially coats the tracks such that it is only located beneath the tracks. In a third embodiment, the magnetic material partially coats the tracks such that it is only located over the tracks. In a fourth embodiment, the magnetic material partially coats the tracks such that it is located both beneath and over the tracks.

Figure 2:
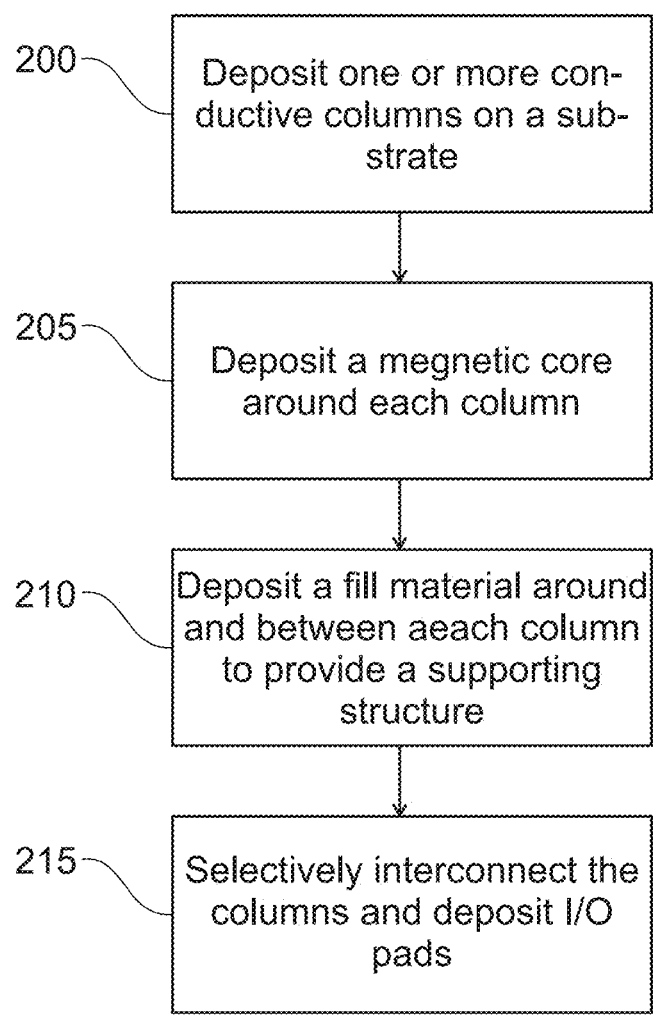
FIG. 2 shows the main steps in the fabrication process of the vertical magnetic structure of the inductor device of the present invention.

FIG. 2 shows the main steps in the fabrication process to obtain the inductor device of the present invention. In step 200, one or more columns of conductive material are deposited on a support substrate, the one or more columns comprising an input terminal and an output terminal. In step 205, a magnetic layer in the form of a magnetic core is deposited around each column. In step 210, a fill material is deposited around and between each column to provide a supporting structure. In step 215, the columns are selectively interconnected with tracks of conductive material and I/O pads are deposited on the input terminal and the output terminal.

In the case where the inductor device comprises three or more columns comprising an input column, an output column and a plurality of intermediate columns, the selective interconnection of the columns with tracks of conductive material is such that the first end of each intermediate column is conductively coupled to the first end of a first adjacent column and isolated from the first end of a second adjacent column and the second end of each intermediate column is conductively coupled to the second end of the second adjacent column and not coupled to the second end of the first adjacent column. The I/O pad for wire bonding/flip chip is then connected to the end of the input column and the end of the output column that is not connected to an intermediate column.

FIG. 3 shows a detailed schematic of one fabrication process to obtain the inductor device of the present invention, where the device comprises an input column, an output column and at least one intermediate column. In the first step of the fabrication process, spaced apart columns of conductive material are deposited on a first support substrate (step 300). In step 305, a first magnetic layer in the form of a magnetic core comprising alternating laminations of magnetic and dielectric materials is conformally deposited on and in between each column. This involves coating all of the exposed surfaces of the columns and the first support substrate with the magnetic core such that the magnetic core is deposited vertically around each column, horizontally on the first support substrate between each column, and horizontally on a first end of each column distal to the first support substrate. In step 310, a fill material is deposited around and in the gaps between each column to provide a supporting structure. In step 315, the surface of the supporting structure is planarized to remove the horizontal magnetic core deposited on the first end of each column. In step 320, the intermediate columns are connected with a first set of conductive tracks such that the first end of each intermediate column is conductively coupled to the first end of a first adjacent column and isolated from the first end of a second adjacent column. I/O pads for wire bonding/flip chip may also be connected at this stage. In step 325, a second support substrate is mounted to the first set of tracks of conductive material and the structure is inverted. In step 330, the first support substrate is removed. In step 335, the surface of a second end of each column is planarized in order to remove the horizontal magnetic core between each column. In step 340, the intermediate columns are connected with a second set of interconnecting conductive tracks such that the second end of each intermediate column is conductively coupled to the second end of the second adjacent column and not coupled to the second end of the first adjacent column. A second I/O pad for wire bonding/flip chip may also be connected at this stage.

FIG. 4 shows a detailed schematic of another fabrication process to obtain the inductor device of the present invention, where the device comprises an input column, an output column and at least one intermediate column. In the first step of the fabrication process, a plurality of lengths of a first insulating material are deposited on a support substrate, where a first set of tracks of conductive material are then deposited on those portions of the support substrate which are not in contact with the first insulating material. I/O pads may also be deposited at this stage (step 400). In step 405, further first insulating material is deposited on the plurality of lengths of the first insulating material and also on selective portions of the first set of tracks of conductive material in order to form a plurality of spaced apart columns of the first insulating material. In step 410, columns of conductive material are deposited between the plurality of spaced apart columns of insulating material such that a second end of each intermediate column is conductively coupled to the second end of a first adjacent column by the first set of tracks of conductive material and isolated from the second end of a second adjacent column. In step 415, the first insulating material is removed. In step 420, a thin film of a second insulating material is deposited on both the planar surfaces of the conductive columns and the support substrate. A first magnetic layer in the form of a magnetic core is then deposited around each column. In step 425, a fill material is deposited around and in the gaps between each conductive column to form a supporting structure. In step 430, the second insulating material on a first end of the conductive columns is removed. In step 435, the intermediate columns are connected with a second set of interconnecting conductive tracks such that the first end of each intermediate column is conductively coupled to the first end of the second adjacent column and not coupled to the first end of the first adjacent column. I/O pads for wire bonding/flip chip may also be connected at this stage.

FIG. 5 shows four additional alternative embodiments of the inductor device of the present invention. In the embodiment of FIG. 5b, each column is embedded in a magnetic layer formed by a magnetic core, which also acts as a supporting structure. The magnetic core comprises a solid sheet of magnetic material.

FIGS. 5a and 5c shows a top down and a side view respectively of an alternative embodiment to FIG. 5b, where the magnetic core comprises a plurality of rings concentric to each column, with a vertically-oriented intervening dielectric in between the rings. FIG. 5e shows a side view of yet another embodiment, where the magnetic core comprises a plurality of rings concentric to each column of alternating horizontal laminations of magnetic and dielectric materials, with a vertically-oriented intervening dielectric in between the rings.

FIG. 5d shows an embodiment similar to FIG. 5b, but where the magnetic core comprises a laminated solid sheet of alternating horizontal laminations of magnetic and dielectric materials.

FIG. 6 shows a detailed schematic of an embodiment of the fabrication process to obtain the inductor device of the type shown in FIG. 5b, where the device comprises an input column, an output column and at least one intermediate column. In the first step of the fabrication process, a plurality of spaced apart columns of a first insulating material are deposited on a first support substrate (600). In step 605, columns of conductive material are then deposited between the plurality of spaced apart columns of the first insulating material. In step 610, the first insulating material is removed. In step 615, a second layer and a third layer of the same insulating material are deposited on the first support substrate. The second layer of insulating material makes contact with the support substrate and extends between the columns of conductive material. The third layer of insulating material is located on a portion of the surface of second layer of insulating material. In step 620, a thin film of a fourth insulating material of a different type to the second and third layers of insulation is deposited on both the planar surfaces of the conductive columns and the second and third insulating layers. In step 625, the second and third layers of insulating material are removed. In step 630, a fifth insulation layer is deposited around the vertical sidewalls of the conductive columns. In step 635, a magnetic layer is deposited in the spaces between the conductive columns so as to form a magnetic core and act as a supporting structure. The thickness of the magnetic core is equal to the thickness of the conductive columns. As previously explained, the magnetic core can be in the form of a solid sheet or take the form of rings which are concentric to each column, with a vertically-oriented dielectric in between the rings. In step 640, the fourth insulating material is removed from the conductive columns. In step 645, a sixth and a seventh layer of insulation is deposited on the surface of the magnetic core distal from the first support substrate. In step 650, a seed layer is deposited on top of the sixth and seventh layers of insulation. In step 655, the columns are connected with a first set of interconnecting conductive tracks such that a first end of each intermediate column is conductively coupled to the first end of a second adjacent column and not coupled to the first end of a first adjacent column. I/O pads for wire bonding/flip chip may also be connected at this stage. In step 660, the surface of the first end of each column is planarized in order to remove the excess material. In step 665, a second support substrate is mounted to the first set of tracks of conductive material and the structure is inverted. In step 670, the first support substrate is removed. In step 675, the columns are connected with a second set of interconnecting conductive tracks such that a second end of each intermediate column is conductively coupled to the second end of the first adjacent column and not coupled to the second end of the second adjacent column. I/O pads for wire bonding/flip chip may also be connected at this stage.

Steps 600a to 630a show an alternative technique which can be performed in place of steps 600 to 630. In this technique, a plurality of spaced apart conductive columns are deposited on a first support substrate (600a). In step 605a, a dielectric is deposited on all of the exposed surfaces of the columns and the first support substrate such that the dielectric is deposited vertically around each column, horizontally on the first support substrate between each column, and horizontally on a first end of each column distal to the first support substrate. In step 610a, a second support substrate is mounted to the columns and the structure is inverted. In step 615a, the first support substrate is removed. In step 620a, second and third layers of insulation material are deposited on the first support substrate. In step 625a, a dielectric is deposited on the horizontal surfaces of the columns and the second and third layers of insulation material. In step 630a, the second and third layers of insulation material are removed. The process then continues at step 635, as previously described.

FIG. 7 shows a detailed schematic of one embodiment of the fabrication process to obtain the inductor device of the type shown in FIG. 5d, where the device comprises an input column, an output column and at least one intermediate column. In the first step, a magnetic layer in the form of a magnetic core, which is in the form of a planar sheet comprising a plurality of alternating horizontal laminations of magnetic and dielectric materials, is deposited on a first support substrate (700). In step 705, a selective etch creates discrete columnar voids in the magnetic core. In step 710, a first insulation layer is deposited conformally, covering both the planar and vertical surfaces of the magnetic core. In step 715, a second support substrate is mounted to the magnetic core and the structure is inverted. In step 720, the first support substrate is removed. In step 725, columns of conductive material are deposited into the discrete columnar voids in the magnetic core. The process then continues to step 645 of FIG. 6 until step 670 of FIG. 6. Then, in step 730 the columns are connected with a second set of interconnecting conductive tracks such that a second end of each intermediate column is conductively coupled to the second end of the second adjacent column and not coupled to the second end of the first adjacent column. I/O pads for wire bonding/flip chip may also be connected at this stage.

In the embodiment shown in FIG. 7, the magnetic core is in the form of a solid sheet. However, as previously explained in relation to FIG. 5, in another embodiment, the magnetic core can take the form of rings which are concentric to each columnar void, with a vertically-oriented dielectric in between the rings.

FIG. 8 shows a 3D view of the inductor device of FIG. 1a along with a 90° cross-sectional view of a column of conductive material from that same structure (the supporting structure is not shown for clarity purposes). The column of conductive material is surrounded by a first magnetic layer in the form of a magnetic core, where the magnetic core may comprise laminations of alternating magnetic and dielectric materials.

Figure 9A:
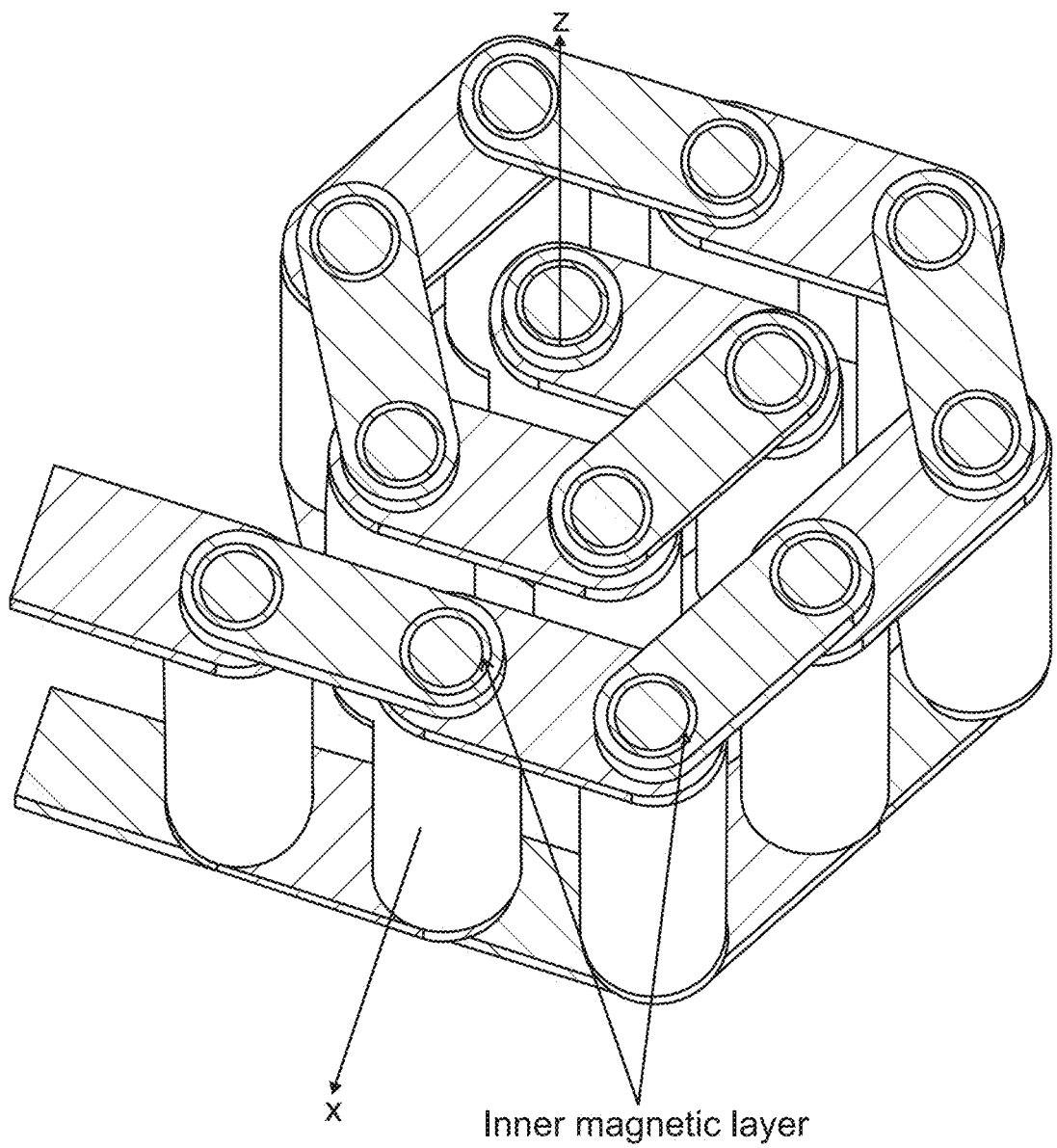
FIG. 9a shows an embodiment of the invention where the inductor device comprises a coaxial vertical magnetic structure.
Figure 9B:
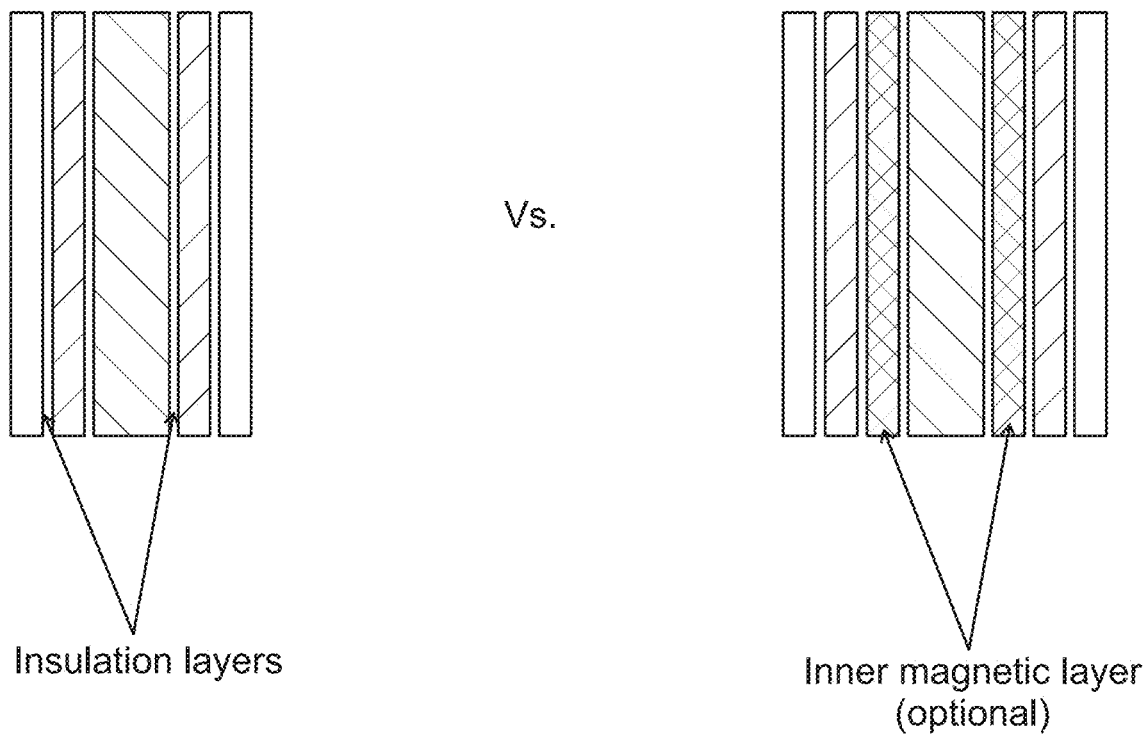
FIG. 9b shows a 90° cross-sectional view of a coaxial column of conductive material of the same structure as that of FIG. 9a, and FIG. 10 shows a detailed schematic of the fabrication process of the inductor device of FIG. 9.

FIG. 9a shows a 3D view of another embodiment of the inductor device of the present invention where the structure comprises a coaxial or concentric structure (the supporting structure is not shown for clarity purposes). This concentric structure provides a coupling of 0.9, as well as a perfect dc flux cancelation in the core. If the Re-Distribution Layer (RDL) top and bottom traces are placed on top of each other, a transformer with ultra-low leakage inductance and excellent coupling is achieved. A 90° cross-sectional view of a concentric column of conductive material from that same structure is also shown in FIG. 9b, where each concentric column comprises two individual columns of conductive material that are electrically insulated from one another, where each individual column of conductive material may be further surrounded by a magnetic layer in the form of a magnetic core. In one embodiment, the magnetic core comprises alternating vertical laminations of magnetic and dielectric materials.

FIG. 10 shows a detailed schematic of the fabrication process of the inductor device shown in FIG. 9, where the device comprises an input column, an output column and at least one intermediate column. In the first step of the fabrication process, a first set of conductive columns is deposited on a first support substrate (1000). In step 1005, a first magnetic layer in the form of a magnetic core is conformally deposited on both the planar and vertical surfaces of the conductive columns and on the surface of the first support substrate between the columns. In step 1010, a layer of conductive material is conformally deposited on top of the first magnetic core, to form a second set of conductive columns concentric to the first set of conductive columns. In step 1015, a second magnetic layer in the form of a magnetic core is conformally deposited on top of the second set of conductive columns. In step 1020, a fill material is deposited around and in the gaps between the columns to provide a supporting structure. In step 1025, the surface of a first end of each column distal to the first support substrate is planarized in order to remove excess material on top of and between each column. In step 1030, a first set of interconnecting tracks of conductive material are deposited such that the first end of each intermediate column of the first set of columns is conductively coupled to the first end of a first adjacent column of the first set of columns and isolated from the first end of a second adjacent column of the first set of columns and the first end of each intermediate column of the second set of columns is conductively coupled to the first end of a first adjacent column of the second set of columns and isolated from the first end of a second adjacent column of the second set of columns, where the first set of interconnecting tracks of conductive material for the second set of conductive columns are electrically insulated from the first set of interconnecting tracks of conductive material for the first set of conductive columns. I/O pads for wire bonding/flip chip may also be connected at this stage. In step 1035, a second support substrate is mounted to the first set of tracks of conductive material and the structure is inverted. In step 1040, the first support substrate is removed. In step 1045, the surface of a second end of each column is planarized in order to remove the horizontally-oriented material between each column. In step 1050, the columns are connected with a second set of interconnecting conductive tracks such that a second end of each intermediate column of the first set of columns is conductively coupled to the second end of the second adjacent column of the first set of columns and not coupled to the second end of the first adjacent column of the first set of columns and a second end of each intermediate column of the second set of columns is conductively coupled to the second end of the second adjacent column of the second set of columns and not coupled to the second end of the first adjacent column of the second set of columns, where the second set of interconnecting tracks of conductive material for the second set of conductive columns are electrically insulated from the second set of interconnecting tracks of conductive material for the first set of conductive columns. I/O pads for wire bonding/flip chip may also be connected at this stage.

In the embodiment shown, each of the first and the second magnetic cores comprise alternating layers of magnetic and dielectric materials. However, it will be appreciated that in an alternative embodiment, the magnetic core may simply comprise a sheet of magnetic material.

In the embodiments of the invention shown in FIGS. 8 and 9, the conductive columns are located on square vertices. However, any other suitable arrangement of columns could equally well be used. For example, to pack columns more densely, the columns could be arranged in a honeycomb structure or connected in double helix form where the I/O pads are on adjacent columns to ease routing in the electrical circuit. A double helix form corresponds to two interleaved inductor devices that wind around each other like individual strands of deoxyribonucleic acid (DNA). The double-helical strands will ideally have a spiral topology, winding from a common centre outwards. The double-helical topology would have a reduced cross-sectional area, as opposed to a conventional toroidal structure, and the cross-section itself would consist of either an air core or a magnetic core, which would be in addition to the magnetic core which may or may not surround each of the individual columns. This double-helical form would result in the highest inductance with regards to topology. Additionally, a space-filling arrangement of the columns, such as for example, a curve, could also be used in order to ease routing.

The inductor device of the present invention provides a number of advantages over conventional planar structures. Firstly, and if considered as an inductor, the inductor device achieves high performance because of excellent coupling (that is, extremely low leakage inductance) and high efficiency. The structure has been found to offer 40% higher inductance for the same coil length when compared to existing V-groove inductors. For example, the inductor structure of FIG. 8 with one $Ni_{45}Fe_{55}$ lamination with a 10 μm thick RDL layer achieves L=5.9 nH, L/DCR=0.39 nH/mΩ and L/Footprint=31.9 nH/mm² at the frequency of 100 MHz, with a Q-factor of 7. The saturation current of this structure is 0.8 A, which gives a current density of 4.3 A/mm². In this regard, it should be noted that increasing the diameter of the conductive columns reduces the copper resistance and inductance of the columns, both, thus increasing the saturation current. In the embodiment where the top and bottom conductive tracks are coated with magnetic thin film, a 12% inductance boost is also achieved.

Furthermore, if the inductor of the present invention is implemented using copper columns embedded in magnetic material laminate, as per several of the described embodiments of the invention, the inductance is increased by more than an order of magnitude (approximately 16 times).

Where a laminated magnetic core is used, there is no dielectric material on the flux path, which reduces core losses. Furthermore, copper losses are significantly reduced with vertical current flow, which leads to higher inductor efficiency. In addition, there is no flux crowding, due to the smooth core shape.

In addition, as the first generation of integrated power converter products are based on 2.5D and 3D stack integration technologies, the present invention facilitates achieving efficient, high density in-package IVRs.

When the inductor structure of the present invention is integrated into an integrated voltage regulator circuit, the interconnections between different components on the circuit are being used to act as passive devices in the form of inductors. This results in a fully integrated VR solution where the active circuitry is either monolithically built or packaged with the passive devices, that is the inductors and capacitors. Further, the inductor structure uses its magnetic core to improve the power density and efficiency of the IVR circuit.

Figure 11:
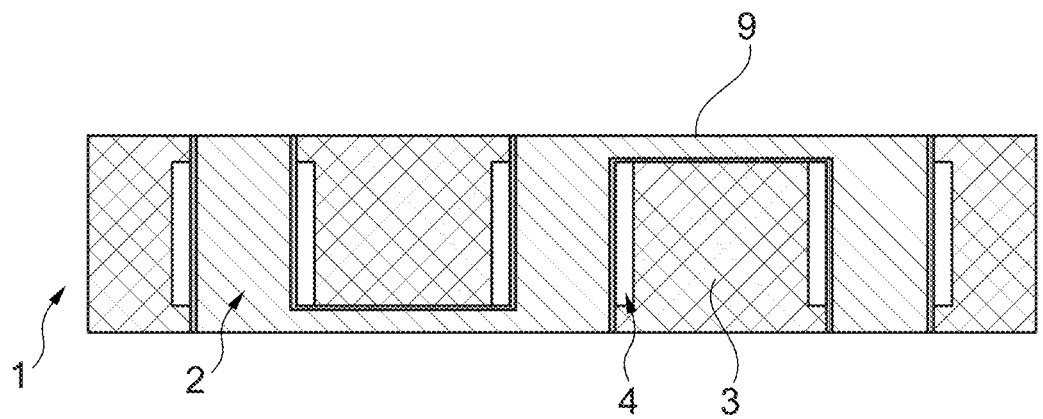
FIG. 11 shows another embodiment of the inductor device of the present invention where the passivation layer is far greater than the width of the magnetic layer.

FIG. 11 shows another embodiment of the inductor device of the present invention. In this embodiment, the supporting structure comprises a passivation layer, as was the case for FIGS. 1a and 1b. However, in FIGS. 1a and 1b the width of the passivation layer was much smaller than the width of the magnetic layer, whereas in the embodiment of FIG. 11, the passivation layer is far greater than the width of the magnetic layer.

Figure 12:
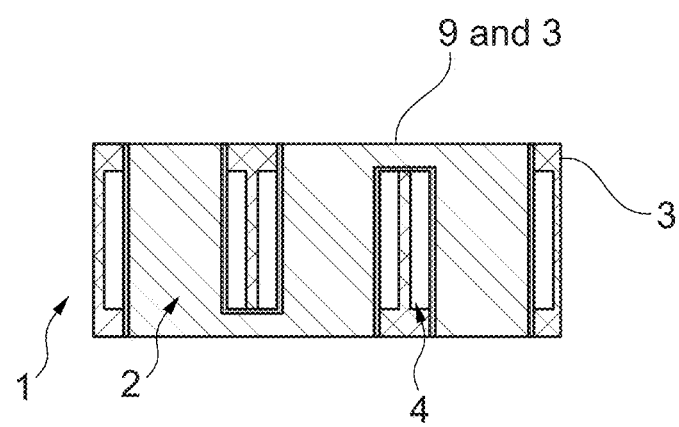
FIG. 12 shows another embodiment of the inductor device of the present invention, where the supporting structure comprises a combination of the interconnecting tracks of conductive material and a passivation layer.

FIG. 12 shows another embodiment of the inductor device of the present invention, where the supporting structure comprises a combination of the interconnecting tracks of conductive material and a passivation layer. It should be noted that the interconnect can support the device due to the short distance (small volume) between the conductive columns.

Figure 13:
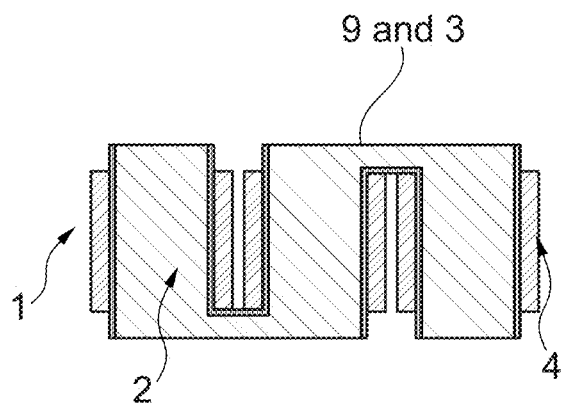
FIG. 13 shows another embodiment of the inductor device of the present invention, where the supporting structure comprises the interconnecting tracks of conductive material.

FIG. 13 shows another embodiment of the inductor device of the present invention, where the supporting structure comprises the interconnecting tracks of conductive material and the conductive columns. In this embodiment, air is used as a dielectric. However, it should be noted that this device is not an air core inductor. This embodiment is discrete and self-supporting, as the small length of the interconnecting tracks results in tiny voids between the columns of conductive material, which overall closely approximates a solid structure with a continuous cross-section.

Figure 14:
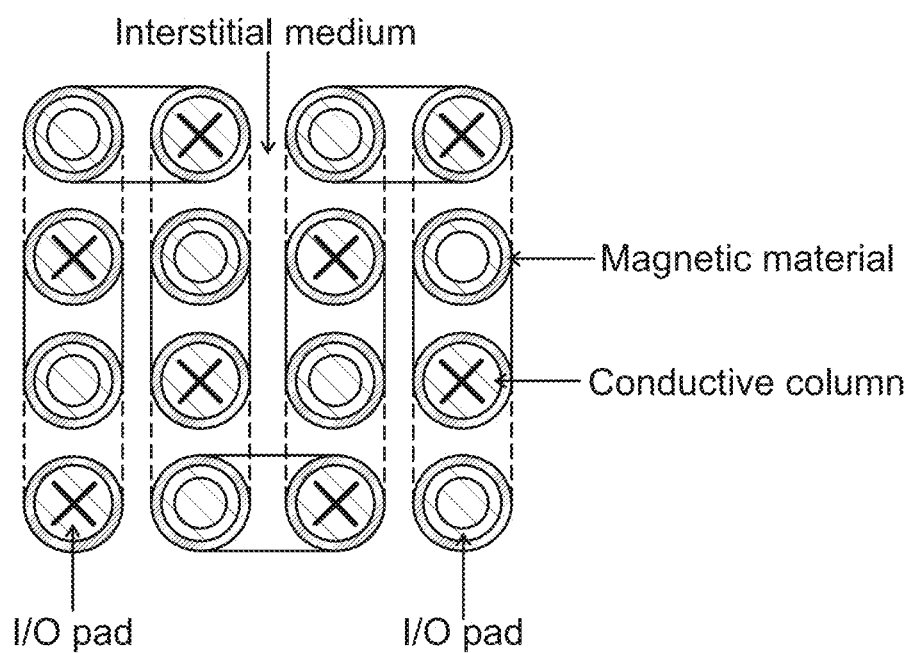
FIG. 14 shows a top down view of the inductor array of FIG. 8.

FIG. 14 shows a top down view of the inductor array of FIG. 8. It can be seen that in this embodiment, the columns of conductive material embedded in the supporting structure (not shown) are separated by an interstitial medium. In this regard it should be understood that the supporting structure comprises the material which provides the mechanical strength of the device. A mechanically strong device is synonymously described as being either discrete or self-supporting, or both. A discrete and/or self-supporting device is thus able to "stand on its own" without being supported by any external forces or bodies, such as for example a semiconducting substrate or a printed circuit board.

The interstitial medium comprises the material that fills the vertically-oriented space between the columns of conductive material. It should be noted that the supporting structure and the interstitial medium may or may not be the same material, depending on the embodiment. Thus, FIG. 5 and FIGS. 11 to 13 also comprise columns of conductive material embedded in a supporting structure and separated by an interstitial medium. The interstitial medium may be a gas, a magnetic material or a non-conductive and non-magnetic material. For example, the interstitial medium comprises a gas in the embodiment of FIG. 13, while the supporting structure comprises the interconnecting tracks of conductive material and the columns of conductive material. However, in the embodiment of FIG. 11, the supporting structure and the interstitial medium both comprise the same material, which is a non-conductive and non-magnetic material.

Figure 15:
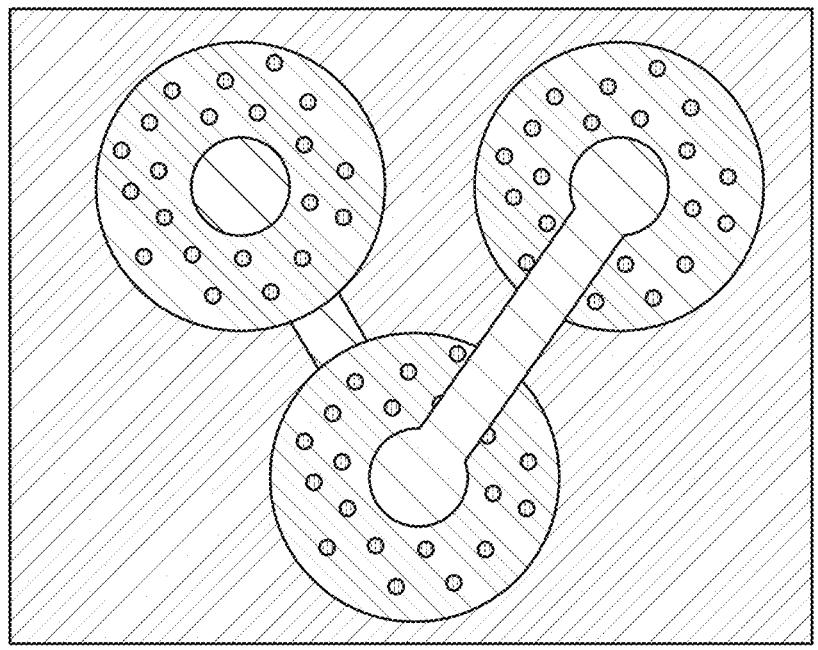

FIG. 15 comprises a variation of the embodiment of FIG. 5a. In this embodiment, the rings of magnetic material comprise magnetic particles suspended in a polymer matrix.

It will be appreciated from the embodiments of FIGS. 11 to 15 that the supporting structure of the present invention is not a conventional substrate. Therefore, the supporting structure is not a semiconductor, glass or a PCB material.

Figure 16:
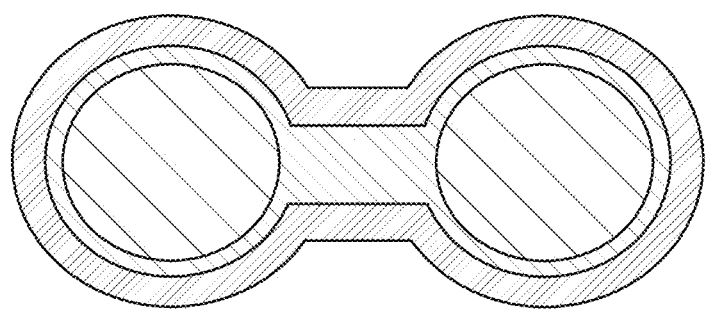
FIG. 16 shows how the width of the dielectric material can be adjusted to tune the coupling between inductors to a desired value.

The coupling factor between two inductors can be tuned by varying the width of the adjoining dielectric. For example, the width of the dielectric material shown in FIG. 16 can be adjusted to tune the coupling between the inductors to a desired value.

In the device of the present invention, the magnetic anisotropy direction is partially a function of the aspect ratio (AR) of the conductive columns, i.e. the ratio of the height of a conductive column to the diameter of a conductive column. This difference in magnetic anisotropy is illustrated for a conductive column having a first aspect ratio in FIG. 17a and for a conductive column having a second higher aspect ratio in FIG. 17b.

Figure 17:
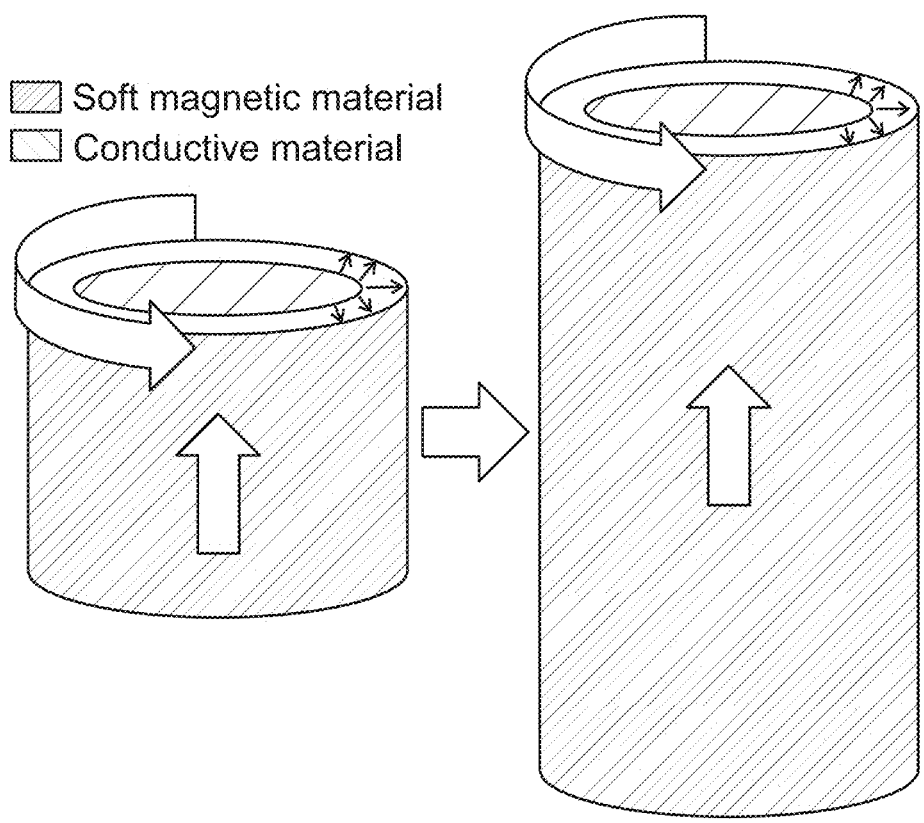
FIG. 17 illustrates the difference in magnetic anisotropy between conductive columns of different aspect ratios.

The three different orientations of magnetic anisotropy are shown in the Figure: circumferential easy-axis (curling counter-clockwise arrow), radial, and axial (vertical), with probable orientations being shown in green while improbable orientations are shown in red. Thus, it can be seen that for a high aspect ratio, the axial direction becomes much more likely, as shown in FIG. 17b. It has been found that at AR=2 and beyond, the magnetic anisotropy orientation shown in FIG. 17b becomes increasingly probable.

In the specification the terms "comprise, comprises, comprised and comprising" or any variation thereof and the terms "include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:
1. A transformer or coupled inductor device comprising:
two interconnected vertical columns of conductive material extending from a substrate embedded in a supporting structure, the two interconnected columns comprising a first column and a second column spaced apart from the first column, each column comprising an inner column portion and an outer column portion concentric with the inner column portion, the outer column portion and the inner column portion each having a first end and a second end, wherein the first end of the first inner column portion and the first outer column portion each comprise an input terminal or an output terminal and the first end of the second inner column portion and the second outer column portion each comprise an input terminal or an output terminal, and wherein the second end of the first inner column portion is conductively coupled to the second end of the second inner column portion by an inner interconnecting track of conductive material, and wherein the second end of the first outer column portion is conductively coupled to the second end of the second outer column portion by an outer interconnecting track of conductive material;

wherein the device further comprises a first magnetic layer surrounding each outer column portion and a second magnetic layer surrounding each inner column portion, wherein the first and second magnetic layers comprise a plurality of vertical laminations comprising alternating magnetic and dielectric layers and the second magnetic layer is provided between each inner column portion and outer column portion.

2. The device of claim 1, wherein the degree of coupling between the inner column portion and the outer column portion is tuned by varying the thickness of the first and/or second magnetic layers.

3. The device of claim 1, where the supporting structure comprises a non-conductive and non-magnetic material.

4. The device of claim 1, wherein the supporting structure comprises the first magnetic layer.

5. The device of claim 1, wherein the first magnetic layer and/or the second magnetic layer comprise magnetic particles suspended in a polymer matrix.

6. The device of claim 5, wherein the first magnetic layer comprises a plurality of rings of magnetic material, each column surrounded by one ring, and further comprising an insulation layer between each of the rings.

7. The device of claim 1, wherein each column is solid.

8. The device of claim 1, wherein each column is hollow.

9. The device of claim 1, wherein the first magnetic layer and/or the second magnetic layer have magnetic anisotropy such that the hard-axis is oriented circumferentially to the columns.

10. An inductor device as claimed in claim 1 comprising:
at least two interconnected columns of conductive material embedded in a supporting structure, wherein the columns are interconnected by tracks of conductive material, wherein the at least two columns comprise an input terminal and an output terminal; and wherein each column is surrounded by a first magnetic layer.

11. The inductor device of claim 10, wherein the supporting structure comprises a non-semiconductive, non-glass, non-PCB material.

12. The inductor device of claim 10, wherein the supporting structure comprises the tracks of conductive material.

13. The inductor device of claim 10, wherein the supporting structure comprises a magnetic material.

14. The inductor device of claim 10, wherein the supporting structure comprises a non-conductive and non-magnetic material.

15. The inductor device of claim 10, wherein the supporting structure comprises a non-conductive and non-magnetic material and the tracks of conductive material.

16. The inductor device of claim 10, wherein the at least two interconnected columns of conductive material embedded in the supporting structure are separated by an interstitial medium.

17. The inductor device of claim 16, wherein the interstitial medium comprises a gas.

18. The inductor device of claim 16, wherein the interstitial medium comprises a magnetic material.

19. The inductor device of claim 16, wherein the interstitial medium comprises a non-conductive and non-magnetic material.

20. The inductor device of claim 10, wherein the first magnetic layer comprises a plurality of rings of magnetic material, each column surrounded by one ring, and further comprising an insulation layer between each of the rings.

21. The inductor device of claim 10, wherein each column is solid.

22. The inductor device of claim 10, wherein each column is hollow.

23. The inductor device of claim 10, wherein each column comprises an inner column portion and an outer column portion concentric with the inner column portion, wherein the first magnetic layer surrounds each outer column portion and a second magnetic layer surrounds each inner column portion.

24. The inductor device of claim 10, wherein the first magnetic layer and/or the second magnetic layer comprise a plurality of vertical laminations comprising alternating magnetic and dielectric layers.

25. The inductor device of claim 20, wherein the coupling factor between the columns of conductive material is tuneable by adjusting the width of the insulation layer.

26. The inductor device of claim 10, wherein the supporting structure comprises the first magnetic layer; and wherein the first and/or second magnetic layer comprise magnetic particles suspended in a polymer matrix.

27. The inductor device of claim 10, wherein the first magnetic layer and/or the second magnetic layer have magnetic anisotropy such that the hard-axis is oriented circumferentially to the columns.

28. The inductor device of claim 27, wherein the magnetic anisotropy is a function of the aspect ratio of the columns of conductive material.

29. The inductor device of claim 10, wherein the device comprises a discrete, self-supporting device.

* * * * *